US011309720B2

(12) United States Patent
Ito et al.

(10) Patent No.: US 11,309,720 B2
(45) Date of Patent: Apr. 19, 2022

(54) LITHIUM ION BATTERY CONTROL DEVICE, AND LITHIUM ION BATTERY CONTROL METHOD

(71) Applicant: HONDA MOTOR CO., LTD., Tokyo (JP)

(72) Inventors: Yuki Ito, Wako (JP); Atsushi Tamai, Wako (JP); Kenji Sato, Wako (JP); Kazuhito Nakao, Wako (JP); Hajime Abe, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 287 days.

(21) Appl. No.: 16/569,695

(22) Filed: Sep. 13, 2019

(65) Prior Publication Data

US 2020/0099235 A1    Mar. 26, 2020

(30) Foreign Application Priority Data

Sep. 26, 2018  (JP) ............................. JP2018-180883

(51) Int. Cl.
*H02J 7/00* (2006.01)
*H01M 10/0525* (2010.01)
(Continued)

(52) U.S. Cl.
CPC ........ *H02J 7/0021* (2013.01); *G01R 31/3835* (2019.01); *H01M 10/0525* (2013.01); *H01M 10/425* (2013.01); *H01M 2010/4271* (2013.01)

(58) Field of Classification Search
CPC .... H02J 7/0021; H02J 2310/48; H02J 7/0048; H02J 7/005; H02J 7/007188;
(Continued)

(56) References Cited

U.S. PATENT DOCUMENTS 10,886,767 B2 * 1/2021 Kim .................... H01M 10/486
2014/0295261 A1 * 10/2014 Miyake ............. H01M 10/0568
429/199
(Continued)

FOREIGN PATENT DOCUMENTS

JP    2012-065449    3/2012
JP    2014-171335    9/2014
(Continued)

OTHER PUBLICATIONS

Japanese Notice of Allowance for Japanese Patent Application No. 2018-180883 dated Oct. 5, 2021.
(Continued)

*Primary Examiner* — Nha T Nguyen
(74) *Attorney, Agent, or Firm* — Amin, Turocy & Watson, LLP

(57) ABSTRACT

A lithium ion battery control device includes an acquirer configured to acquire a determination index related to the degree of occlusion of a lithium ion battery in which a degree of occlusion of lithium ions occluded in graphite of a negative electrode changes in accordance with an amount of stored power, and a controller configured to perform control for causing the lithium ion battery to be charged with power or causing power of the lithium ion battery to be discharged so that the degree of occlusion is close to a degree of occlusion associated with a specific region when a region associated with the degree of occlusion is determined not to be the specific region associated with the degree of occlusion which includes $LiC_{12}$ having a degree of occlusion represented by a stoichiometric ratio and does not include $LiC_6$ having a degree of occlusion represented by a stoichiometric ratio.

13 Claims, 16 Drawing Sheets

(51) Int. Cl.
  *H01M 10/42* (2006.01)
  *G01R 31/3835* (2019.01)

(58) Field of Classification Search
  CPC .......... H01M 10/0525; H01M 10/425; H01M 2010/4271; H01M 2010/4278; H01M 10/44; H01M 10/48; G01R 31/3835; G01R 31/392; Y02E 60/10
  See application file for complete search history.

(56) References Cited

U.S. PATENT DOCUMENTS

| | | | | |
|---|---|---|---|---|
| 2015/0022157 | A1* | 1/2015 | Takahashi | H02J 7/007 320/134 |
| 2016/0023569 | A1* | 1/2016 | Lee | H01M 10/44 429/50 |
| 2016/0380313 | A1* | 12/2016 | Morita | H02J 7/00712 429/50 |
| 2017/0149256 | A1* | 5/2017 | Srinivasan | H01M 10/486 |
| 2019/0195956 | A1* | 6/2019 | Lim | H01M 10/4207 |
| 2019/0237975 | A1* | 8/2019 | Song | H01M 10/0525 |
| 2020/0328608 | A1* | 10/2020 | Song | H02J 7/007192 |

FOREIGN PATENT DOCUMENTS

| | | |
|---|---|---|
| JP | 2015-122907 | 7/2015 |
| JP | 2015-167118 | 9/2015 |
| JP | 2017-129493 | 7/2017 |
| WO | 2013/157132 | 10/2013 |
| WO | 2015/098012 | 7/2015 |
| WO | 2016/063947 | 4/2016 |
| WO | 2018/211824 | 11/2018 |

OTHER PUBLICATIONS

Endo, et al. "Evaluation of Carbon Fibers as an Anode Material of Lithium Ion Secondary Battery and Their Performances", 1996, No. 172, pp. 121-129.

Ohzuku, et al. "Formation of Lithium-Graphite Intercalation Compounds in Nonaqueous Electrolytes and Their Application as a Negative Electrode for a Lithium Ion (Shuttlecock) Cell", J. Electrochem. Soc., vol. 140, No. 9, Sep. 1993, pp. 2490-2498.

* cited by examiner

LITHIUM ION BATTERY CONTROL DEVICE, AND LITHIUM ION BATTERY CONTROL METHOD

CROSS-REFERENCE TO RELATED APPLICATION

Priority is claimed on Japanese Patent Application No. 2018-180883, filed Sep. 26, 2018, the content of which is incorporated herein by reference.

BACKGROUND

Field

The present invention relates to a lithium ion battery control device, and a lithium ion battery control method.

Description of Related Art

It is known that lithium ion batteries deteriorate due to use. Conventionally, a negative electrode material for minimizing the deterioration of a lithium ion battery has been disclosed (Japanese Unexamined Patent Application, First Publication No. 2015-167118).

However, the minimization of deterioration may not be sufficient in the conventional technology as described above.

SUMMARY

The present invention has been made in consideration of such circumstances and an objective of the present invention is to provide a lithium ion battery control device, and a lithium ion battery control method capable of further minimizing the deterioration of a lithium ion battery.

A lithium ion battery control device, and a lithium ion battery control method according to the following embodiments adopt the following configurations.

(1): According to an aspect, there is provided a lithium ion battery control device for controlling charging or discharging of a lithium ion battery in which a degree of occlusion of lithium ions occluded in graphite of a negative electrode changes in accordance with an amount of stored power, the lithium ion battery control device including: an acquirer configured to acquire a determination index related to the degree of occlusion; and a controller configured to perform control for causing the lithium ion battery to be charged with power or causing power of the lithium ion battery to be discharged so that the degree of occlusion is close to a degree of occlusion associated with a specific region when a region associated with the degree of occlusion is determined not to be the specific region associated with the degree of occlusion which includes $LiC_{12}$ having a degree of occlusion represented by a stoichiometric ratio and does not include $LiC_6$ having a degree of occlusion represented by a stoichiometric ratio on the basis of the determination index acquired by the acquirer.

(2): In the above-described aspect (1), the specific region is a region where $LiC_{12}$ is dominant.

(3): In the above-described aspect (2), the specific region may further include $LiC_{18}$ having a degree of occlusion represented by a stoichiometric ratio and is a region which does not include $LiC_{27}$ having a degree of occlusion represented by a stoichiometric ratio.

(4): In any one of the above-described aspects (1) to (3), the controller is configured to perform control for causing the lithium ion battery to be charged with power or causing power of the lithium ion battery to be discharged so that the degree of occlusion is close to the degree of occlusion associated with the specific region when the region associated with the degree of occlusion is determined to be a first specific region including $LiC_6$ having a degree of occlusion represented by a stoichiometric ratio, a second specific region including $LiC_{18}$ having a degree of occlusion represented by a stoichiometric ratio, or a third specific region including a structure of a degree of occlusion greater than or equal to that of $LiC_{27}$ having a degree of occlusion represented by a stoichiometric ratio.

(5): In the above-described aspect (4), the controller is configured to perform control for causing power of the lithium ion battery to be discharged so that the degree of occlusion is close to the degree of occlusion associated with the third specific region when control for making the degree of occlusion close to the degree of occlusion associated with the specific region is determined not to be performed if the region associated with the degree of occlusion is determined to be the second specific region.

(6): In the above-described aspect (4) or (5), a deterioration rate of the lithium ion battery decreases in an order of the first specific region, the second specific region, and the third specific region, and the specific region, and the controller is configured to perform control for causing the lithium ion battery to be charged with power or causing power of the lithium ion battery to be discharged so that the degree of occlusion is close to the degree of occlusion associated with a region having a lower deterioration rate than a region associated with a present degree of occlusion.

(7): In any one of the above-described aspects (1) to (6), the controller is configured to perform control for causing the lithium ion battery to be charged with power so that the degree of occlusion is close to the degree of occlusion associated with the specific region when the lithium ion battery is charged by an external system.

(8): In any one of the above-described aspects (1) to (7), the controller is configured to perform control for stopping the charging before an amount of charge exceeds an amount of charge associated with the specific region when the lithium ion battery is charged by an external system.

(9): In any one of the above-described aspects (1) to (8), the controller is configured to perform control for causing the lithium ion battery to be charged with power or causing power of the lithium ion battery to be discharged so that the degree of occlusion is close to the degree of occlusion associated with the specific region or the degree of occlusion is close to a degree of occlusion associated with a region having a lower deterioration rate than a region associated with the degree of occlusion when a region associated with the degree of occlusion is determined to be a region different from the specific region if supply of power from the lithium ion battery is in a pause state.

(10): In any one of the above-described aspects (1) to (9), the controller is configured to perform control for causing the lithium ion battery to be charged with power or causing power of the lithium ion battery to be discharged actively so that the degree of occlusion is close to the degree of occlusion associated with the specific region or the degree of occlusion is close to a degree of occlusion associated with a region having a lower deterioration rate than a region associated with the degree of occlusion when a region associated with the degree of occlusion is determined to be a region different from the specific region in an operation state in which the lithium ion battery is supplying power as compared with when the region associated with the degree of occlusion is determined to be the specific region.

(11): According to an aspect, there is provided a lithium ion battery control device for controlling charging or discharging of a lithium ion battery in which a degree of occlusion of lithium ions occluded in graphite of a negative electrode changes in accordance with an amount of stored power, the lithium ion battery control device including: an acquirer configured to acquire a determination index related to the degree of occlusion; and a controller configured to perform control for causing the lithium ion battery to be charged with power or causing power of the lithium ion battery to be discharged so that the degree of occlusion is close to a degree of occlusion associated with a specific region when a region associated with the degree of occlusion is determined to correspond to a first region, a second region, or a third region among the first region where the degree of occlusion is greater than or equal to a first threshold value, the specific region where the degree of occlusion is less than the first threshold value and greater than or equal to a second threshold value, the second region where the degree of occlusion is less than the second threshold value and greater than or equal to a third threshold value, and the third region where the degree of occlusion is less than the third threshold value on the basis of the determination index acquired by the acquirer.

(12): In any one of the above-described aspects (1) to (11), the determination index is an index according to a capacity of the lithium ion battery, an SOC, a cell open circuit voltage of the lithium ion battery, an index according to a first correlation between the SOC and the cell open circuit voltage, or an index according to a second correlation between a capacity and a voltage.

(13): In any one of the above-described aspects (1) to (12), the controller is configured to further identify a region associated with the degree of occlusion of the lithium ion battery using a degree of deterioration of the lithium ion battery.

(14): In any one of the above-described aspect (12) or (13), the controller is configured to correct the determination index using a preset correction coefficient according to the degree of deterioration of the lithium ion battery and identify the region associated with the degree of occlusion on the basis of a determination index after the correction.

(15): In any one of the above-described aspects (1) to (14), the lithium ion battery control device further includes a generator configured to generate a model for determining the region associated with the degree of occlusion on the basis of information acquired through charging and discharging control by performing the charging and discharging control for performing constant-current charging and constant-current discharging at a prescribed rate or less in the lithium ion battery.

(16): In any one of the above-described aspects (1) to (15), the lithium ion battery control device further includes a generator configured to estimate a relationship between a capacity and a voltage using voltage data in a prescribed current range in the lithium ion battery and generate a model for determining the region associated with the degree of occlusion using an estimation result.

(17): According to an aspect, there is provided a lithium ion battery control method including: acquiring, by a computer, a determination index related to a degree of occlusion of a lithium ion battery in which the degree of occlusion of lithium ions occluded in graphite of a negative electrode changes in accordance with an amount of stored power; and performing, by the computer, control for causing the lithium ion battery to be charged with power or causing power of the lithium ion battery to be discharged so that the degree of occlusion is close to a degree of occlusion associated with a specific region when a region associated with the degree of occlusion is determined not to be the specific region associated with the degree of occlusion which includes $LiC_{12}$ having a degree of occlusion represented by a stoichiometric ratio and does not include $LiC_6$ having a degree of occlusion represented by a stoichiometric ratio on the basis of the acquired determination index.

(18): According to an aspect, there is provided a storage medium for causing a computer to: acquire a determination index related to a degree of occlusion of a lithium ion battery in which the degree of occlusion of lithium ions occluded in graphite of a negative electrode changes in accordance with an amount of stored power; and perform control for causing the lithium ion battery to be charged with power or causing power of the lithium ion battery to be discharged so that the degree of occlusion is close to a degree of occlusion associated with a specific region when a region associated with the degree of occlusion is determined not to be the specific region associated with the degree of occlusion which includes $LiC_{12}$ having a degree of occlusion represented by a stoichiometric ratio and does not include $LiC_6$ having a degree of occlusion represented by a stoichiometric ratio on the basis of the acquired determination index.

According to the above-described aspects (1) to (18), it is possible to further minimize the deterioration of the lithium ion battery.

DETAILED DESCRIPTION

Hereinafter, embodiments of a lithium ion battery control device, a lithium ion battery control method, and a storage medium will be described with reference to the drawings.

In the following description, a lithium ion battery control device, a lithium ion battery control method, and a storage medium for controlling a lithium ion battery mounted in a vehicle will be described. Alternatively (or additionally), a lithium ion battery control device, a lithium ion battery control method, and a storage medium for controlling a lithium ion battery mounted in a device or equipment equipped with the lithium ion battery such as a smartphone, game equipment, or a device storing electric power generated by a power generator may be used.

FIRST EMBODIMENT

[Overall Configuration]

Figure 1:
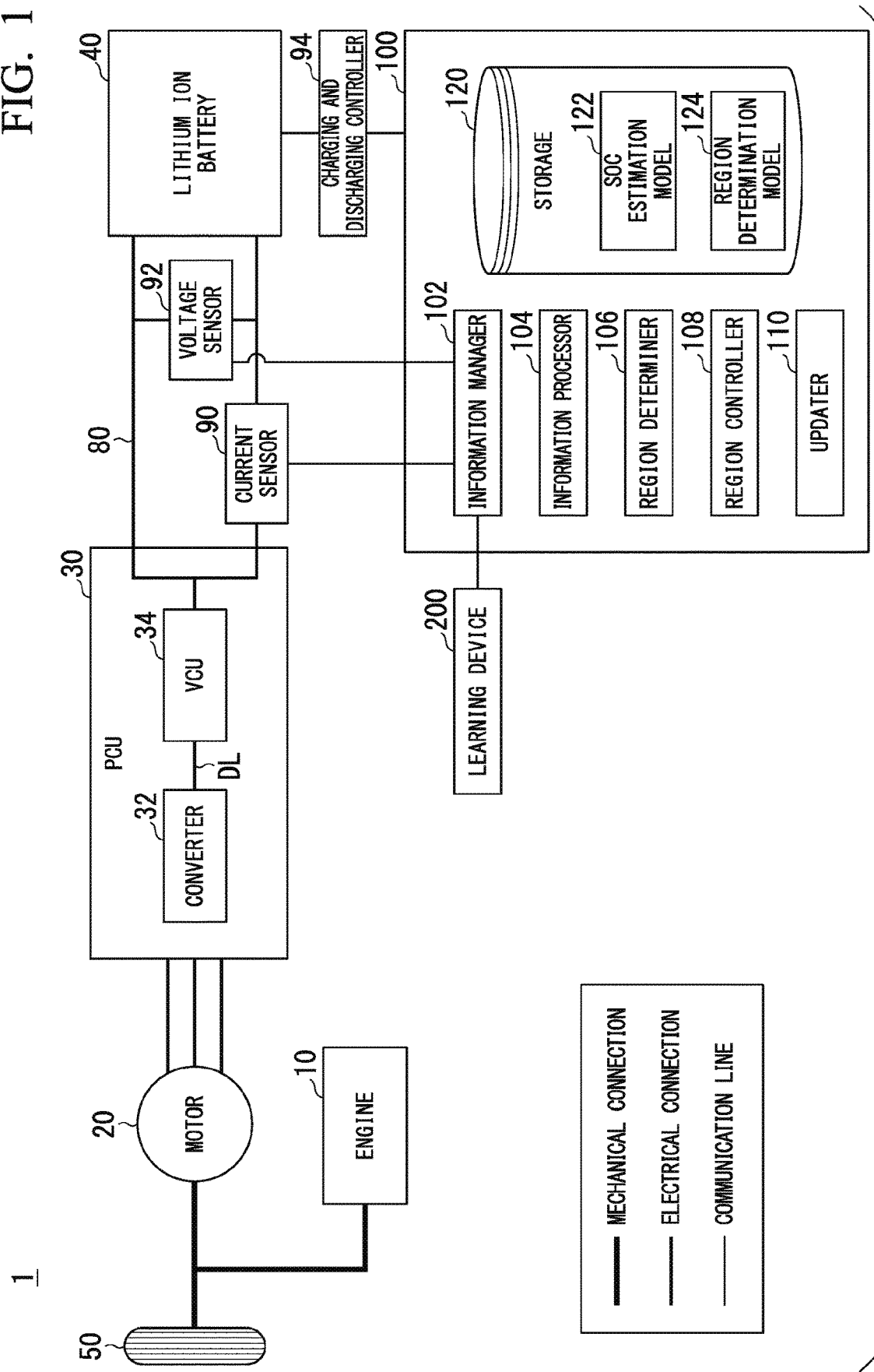
FIG. 1 is a diagram showing an example of a configuration of an electric vehicle equipped with a power storage system.

FIG. 1 is a diagram showing an example of a configuration of an electric vehicle equipped with a power storage system 1. The electric vehicle equipped with the power storage system 1 is, for example, a vehicle such as a two-wheeled vehicle, a three-wheeled vehicle, or a four-wheeled vehicle, and a drive source thereof is a motor or a combination of a motor and an internal combustion engine such as a diesel engine or a gasoline engine. The motor operates using discharge power of a secondary battery. In the following description, as an example, the electric vehicle will be described as a hybrid vehicle having an engine or a motor as a drive source.

As shown in FIG. 1, for example, the power storage system 1 is equipped with an engine 10, a motor 20, a power control unit (PCU) 30, a lithium ion battery 40, a driving wheel 50, a current sensor 90, a voltage sensor 92, a charging and discharging controller 94, a control device 100, and the like.

The engine 10 is an internal combustion engine that outputs power by burning fuel such as gasoline. The engine 10 may be, for example, a reciprocating engine including a cylinder and a piston, an intake valve, an exhaust valve, a fuel injection device, a spark plug, a connecting rod, a crankshaft, and the like. The engine 10 may be a rotary engine.

The motor 20 is, for example, a three-phase alternating current generator. The motor 20 is, for example, a traveling motor. The motor 20 outputs power to the driving wheel 50 using the supplied power. The motor 20 generates electric power using the kinetic energy of the vehicle at the time of deceleration of the vehicle. The motor 20 performs driving and regeneration of the vehicle. The regeneration is a power generation operation of the motor 20. The motor 20 may include a motor for power generation. For example, the motor for power generation generates electric power using the power output by the engine 10.

The PCU 30 includes, for example, a converter 32 and a voltage control unit (VCU) 34. As an example, these components are integrated as the PCU 30. These components may be arranged in a distributed manner.

The converter 32 is, for example, an alternating current (AC)-direct current (DC) converter. A DC-side terminal of the converter 32 is connected to the VCU 34 via a DC link DL. The converter 32 converts an AC generated by the motor 20 into a DC and outputs the DC to the DC link DL or converts a DC supplied through the DC link DL into an AC and supplies the AC to the motor 20.

The VCU 34 is, for example, a DC-DC converter. The VCU 34 boosts the power supplied from the lithium ion battery 40 and outputs the boosted power to the converter 32.

The lithium ion battery 40 is, for example, a battery capable of being repeatedly charged and discharged. The lithium ion battery 40 is connected to the PCU 30 through a power line 80. The lithium ion battery 40 includes, for example, a plurality of battery blocks, and the battery blocks are electrically connected to each other in series. Each positive terminal and each negative terminal of the battery block are connected to the PCU 30.

The current sensor 90 is attached to the power line 80. The current sensor 90 detects a current at a prescribed measurement point on the power line 80. The voltage sensor 92 detects a voltage between terminals of the lithium ion battery 40. For example, the voltage sensor 92 may include a plurality of voltage sensors, which may detect voltages between terminals of different battery blocks. In addition to these sensors, a temperature sensor for detecting a temperature of the lithium ion battery 40 and a current sensor for detecting a current output by the lithium ion battery 40 within a housing (not shown) in which the lithium ion battery 40 is housed may be provided.

The charging and discharging controller 94 causes the lithium ion battery 40 to be charged by controlling a charging circuit (not shown) of the lithium ion battery 40 or causes the lithium ion battery 40 to be discharged by controlling a discharging circuit (not shown) of the lithium ion battery 40 or a load connected to the lithium ion battery 40 on the basis of an instruction of the control device 100.

[Functional Configuration of Control Device]

For example, the control device 100 includes an information manager 102, an information processor 104, a region determiner 106, a region controller 108, an updater 110, and a storage 120. The information manager 102, the information processor 104, the region determiner 106, the region controller 108, and the updater 110 are implemented by a hardware processor such as a central processor (CPU) executing a program (software). Some or all of these components are implemented, for example, by hardware (a circuit unit including circuitry) such as large scale integration (LSI), an application specific integrated circuit (ASIC), a field-programmable gate array (FPGA), or a graphics processor (GPU) or may be implemented by cooperation between software and hardware. For example, the storage 120 is implemented by a nonvolatile storage device such as a read only memory (ROM), an electrically erasable and programmable read only memory (EEPROM), or a hard disk drive (HDD) and a volatile storage such as a random access memory (RAM) or a register.

In the storage 120, for example, a state of charge (SOC) estimation model 122 and a region determination model 124 are stored. These models are models generated by a learning device 200 or the updater 110 to be described below. For example, the SOC estimation model 122 is a model for deriving an SOC indicating a charging state of the lithium ion battery 40 on the basis of a voltage (for example, an open circuit voltage or a closed circuit voltage) or a discharge capacity of the lithium ion battery 40 or the like. Details of the region determination model 124 will be described below. The storage 120 may store a charging or discharging plan, an operation history of the lithium ion battery 40 so far, and correlation information. For example, the correlation information is about a correlation of a capacity, a voltage, a current, and an SOC and the like.

The information manager 102 acquires a detection result of the current sensor 90, a detection result of the voltage sensor 92, a control state of the charging and discharging controller 94, and the like. The information manager 102 manages acquired information, a processing result of the own device, and the like. For example, the information manager 102 causes the above-described information to be stored in the storage 120.

The information processor 104 estimates the SOC or estimates other states of the lithium ion battery 40 on the basis of the information acquired by the information manager 102. The other states include an abnormality and an operation state of the lithium ion battery 40.

The region determiner 106 determines a region showing a state of lithium ions of the negative electrode of the lithium ion battery 40 (a region associated with a degree of occlusion) on the basis of information (a determination index) acquired by the information manager 102 or information (a determination index) estimated by the information processor 104. Details will be described below.

When a region showing the state of lithium ions of the negative electrode of the lithium ion battery 40 (a region associated with a degree of occlusion) is not a prescribed region, the region controller 108 performs control for causing the lithium ion battery 40 to be charged with power or causing power of the lithium ion battery 40 to be discharged so that a region showing a state of lithium ions of the negative electrode of the lithium ion battery 40 is close to a prescribed region (the degree of occlusion is close to a degree of occlusion associated with the prescribed region). The region controller 108 instructs, for example, the charging and discharging controller 94 to perform a charging or discharging process.

The updater 110 updates the region determination model 124 at a prescribed timing. Details will be described below. The updater 110 is an example of a "generator".

[Region and Deterioration Rate]

Here, the inventors have found that the deterioration rate differs according to each region of the negative electrode of the lithium ion battery 40.

Figure 2:
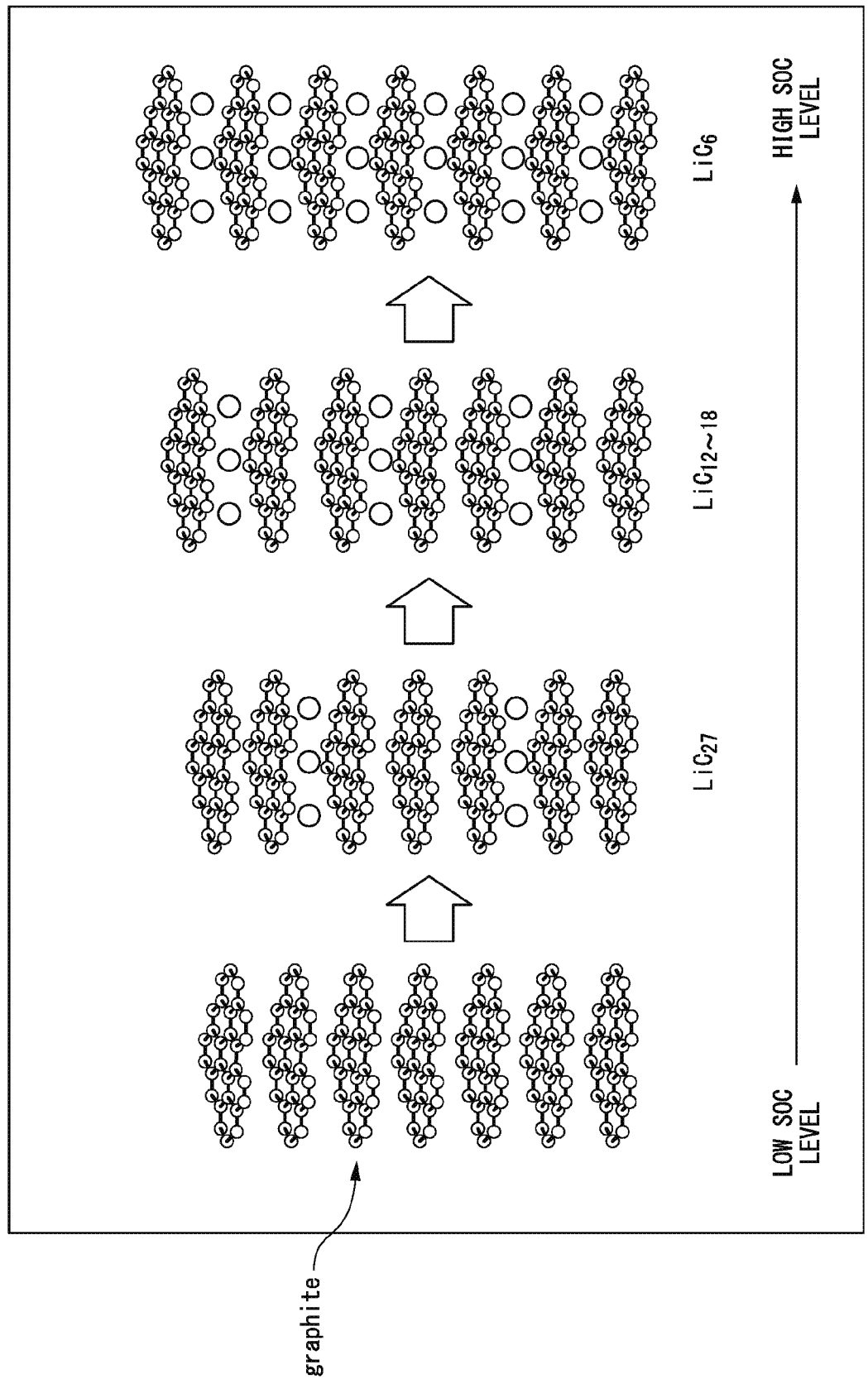
FIG. 2 is an explanatory diagram showing a region of a negative electrode of a lithium ion battery.

FIG. 2 is an explanatory diagram showing the region of the negative electrode of the lithium ion battery 40. Within the lithium ion battery 40, lithium moves from a positive electrode material to a negative electrode material during charging and lithium moves from the negative electrode material to the positive electrode material during discharging. For example, a graphite material or the like is used as the negative electrode material, and lithium ions are occluded between material layers during charging. The lithium ions are regularly occluded for each specific layer of graphite. A division according to an occlusion state (or a degree of occlusion of lithium ions) is referred to as a "region".

The region of the negative electrode changes in accordance with the change in an SOC. The higher an SOC level is, the higher the density of lithium ions occluded in the layer of the graphite is. In accordance with an increase in the density, the region changes in an order of a region D, a region C, a region B, and a region A. Notations such as "$LiC_6$" and "$LiC_{12-18}$" to be described below are Li stoichiometric ratios of lithium carbonate ($LiC_x$).

(Regions A, C, and D)

For example, the region A is a region including "$LiC_6$". In the region A, for example, "$LiC_6$" and "$LiC_{12}$" may coexist. The region B is a region including "$LiC_{12-18}$". Details will be described below.

The region C is a region including "$LiC_{27}$". In the region C, for example, "$LiC_{27}$" and "$LiC_x$" may coexist. Here, "x>27". The "region D" is, for example, a region including "$LiC_x$".

(Region B)

In the region B, there are two types of regions having substantially the same potential. The two types of regions are referred to as a "region B1" and a "region B2". The above-described "region A" is an example of a "first region" or a "first specific region" and the "region B1" is an example of a "specific region". The "region B2" is an example of a "second region" or a "second specific region" and the "region C" is an example of a "third region" or a "third specific region".

Figure 3:
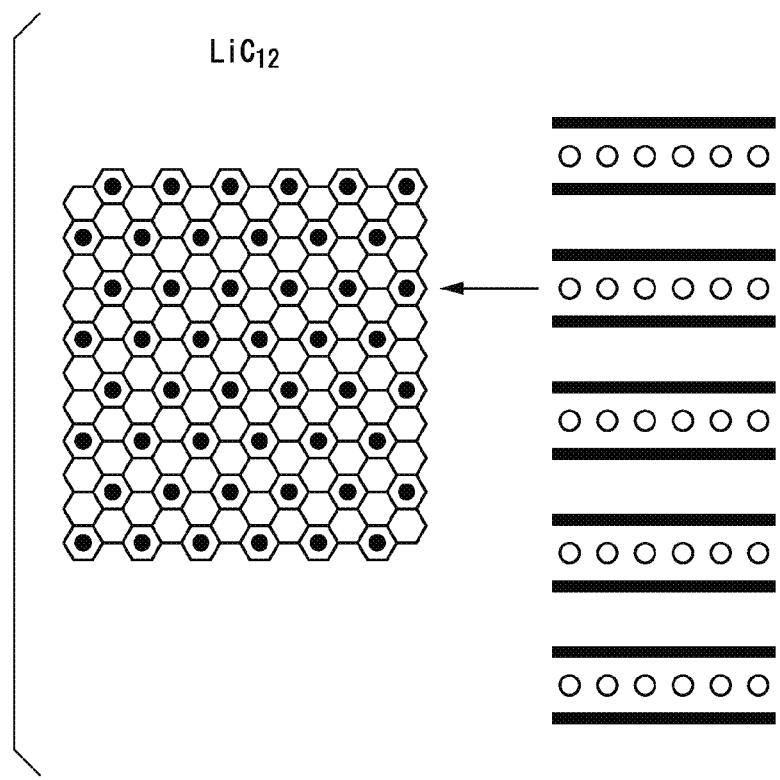
FIG. 3 is an explanatory diagram showing a region B1.

FIG. 3 is an explanatory diagram showing the region B1. The region B1 is a region where lithium ions are densely packed at a Li site (there is no space at the Li site) and structurally stable with few side reactions, and a deterioration rate is low specifically with respect to a potential. The "region B1" is a region including "$LiC_{12}$". The "region B1" is, for example, a region which includes "$LiC_{12}$" and does not include "$LiC_6$". The "region B1" may be, for example, a region where "$LiC_{12}$" and "$LiC_{18}$" coexist.

Figure 4:
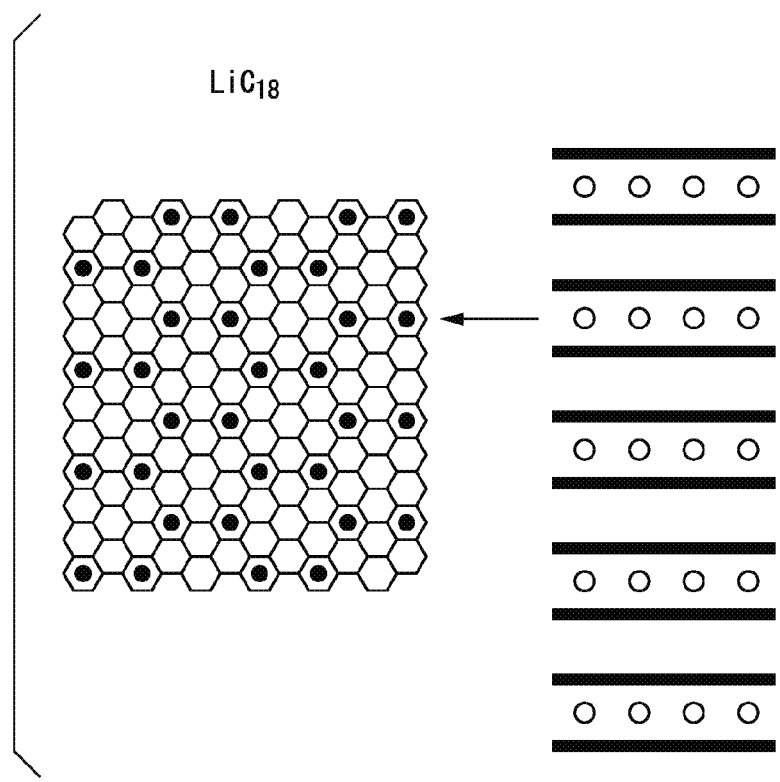
FIG. 4 is an explanatory diagram showing a region B2.

FIG. 4 is an explanatory diagram showing the region B2. The "region B2" is a region including "$LiC_{18}$". The "region B2" is, for example, a region which does not include "$LiC_{12}$". The "region B2" may be, for example, a region where "$LiC_{18}$" and "$LiC_{27}$" coexist.

Figure 5:
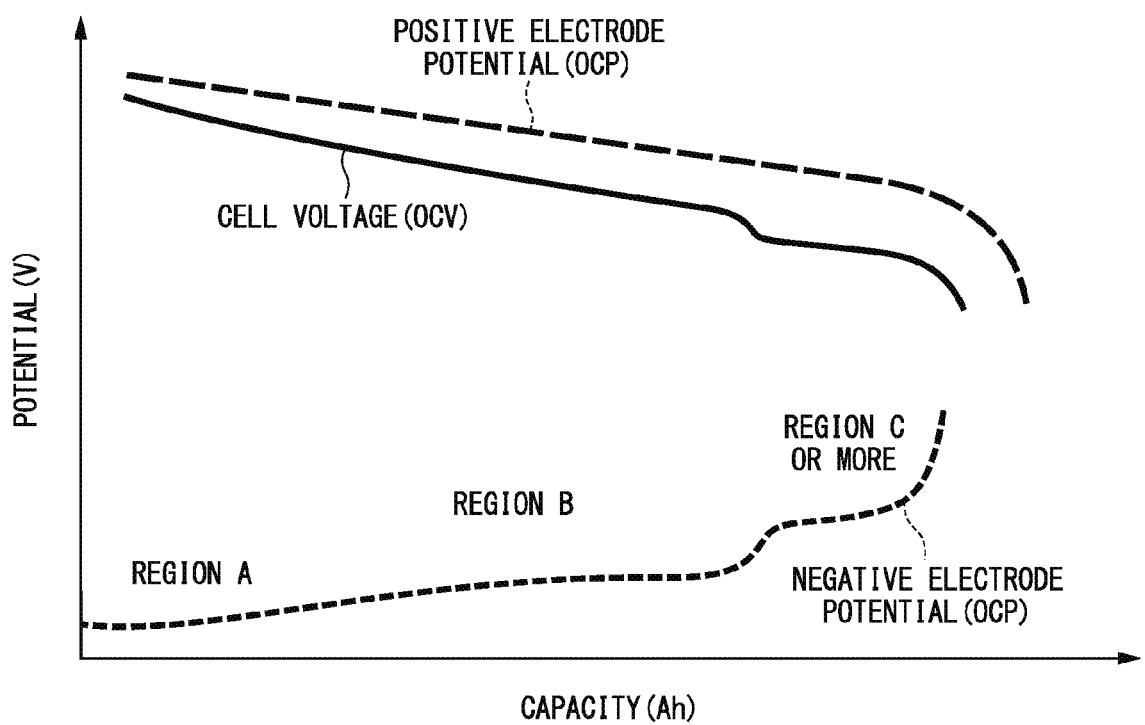
FIG. 5 is a diagram showing an example of a relationship between an OCV, an OCP, and a discharge capacity.

FIG. 5 is a diagram showing an example of a relationship between a cell open circuit voltage (OCV), potentials of the positive electrode and the negative electrode (open circuit potentials (OCPs)), and a discharge capacity of the lithium ion battery 40. The vertical axis in FIG. 5 represents a potential and the horizontal axis in FIG. 5 represents a discharge capacity (Ah). The OCV is a value obtained by subtracting the negative electrode potential (OCP) from the positive electrode potential (OCP). In association with a change in the region, the negative electrode potential changes in a stepwise manner as shown in FIG. 5.

Figure 6:
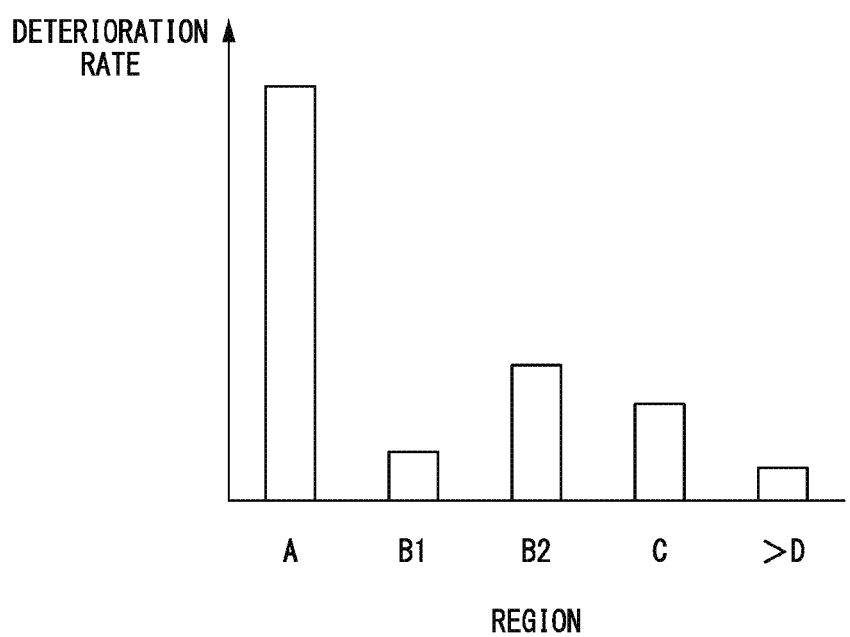
FIG. 6 is a diagram showing a correlation between a region, a deterioration rate of a lithium ion battery, and a potential change of a negative electrode.

FIG. 6 is a diagram conceptually showing the region and the deterioration rate of the lithium ion battery 40. In FIG. 6, the horizontal axis represents a region and the vertical axis represents a deterioration rate. The deterioration rate represents a degree of deterioration per day. FIG. 6 shows an example of deterioration rates of the region A including "$LiC_6$", the region B1 including "$LiC_{12}$", the region B2 including "$LiC_{18}$", the region C including "$LiC_{27}$", and the region D including "$LiC_x$". Here, "x>27".

As shown, as a level of the region increases as in the region D, the region C, and the region B2, the deterioration rate increases. Furthermore, the region A has a higher deterioration rate than the region B2. However, the region B1 has a lower deterioration rate than the region A, the region B2, and the region C.

Conventionally, the deterioration rate may increase as the level of the region increases (as the potential of the negative electrode decreases). However, the inventors have found that the region B1 has a lower deterioration rate than the region A, the region B2, and the region C in contrast to the above-described tendency. It has been found that the deterioration rate tends to decrease in the region where the potential is high except for the region B1, but the deterioration rate is specifically low in the region B1.

[Derivation of Region Switching Point (Part 1)]

Figure 7:
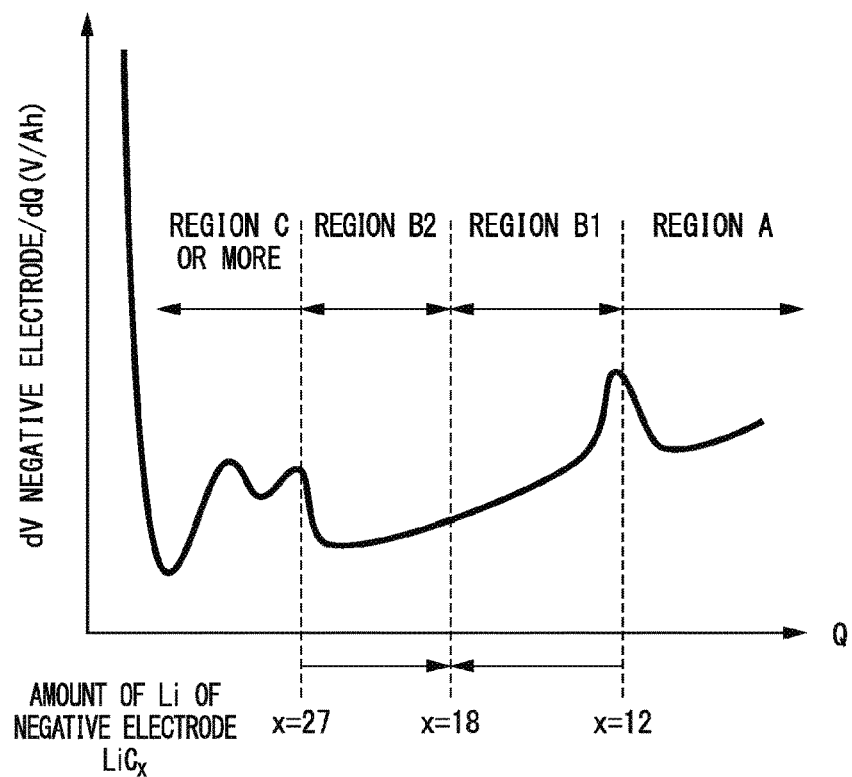
FIG. 7 is an explanatory diagram (part 1) showing switching between regions.

FIG. 7 is an explanatory diagram (part 1) showing switching between regions. Hereinafter, a graph shown in FIG. 7 may be referred to as a "first region determination model". The vertical axis of FIG. 7 represents a differential dV/dQ (V/Ah) of a potential V of the negative electrode and the horizontal axis of FIG. 7 represents a stored power capacity Q.

The negative electrode potential changes in a stepwise manner as shown in FIG. 7 in association with switching between regions. If the differential dV/dQ of the potential V of the negative electrode related to the capacity Q of the lithium ion battery 40 is plotted with respect to the capacity Q, it is characterized in that a maximum value is present at a region switching point. Thus, a switching point (a boundary) of the region A and the region B1, a switching point of the region B1 and the region B2, and a switching point of the region B2 and the region C are detected on the basis of the maximum value.

Figure 8:
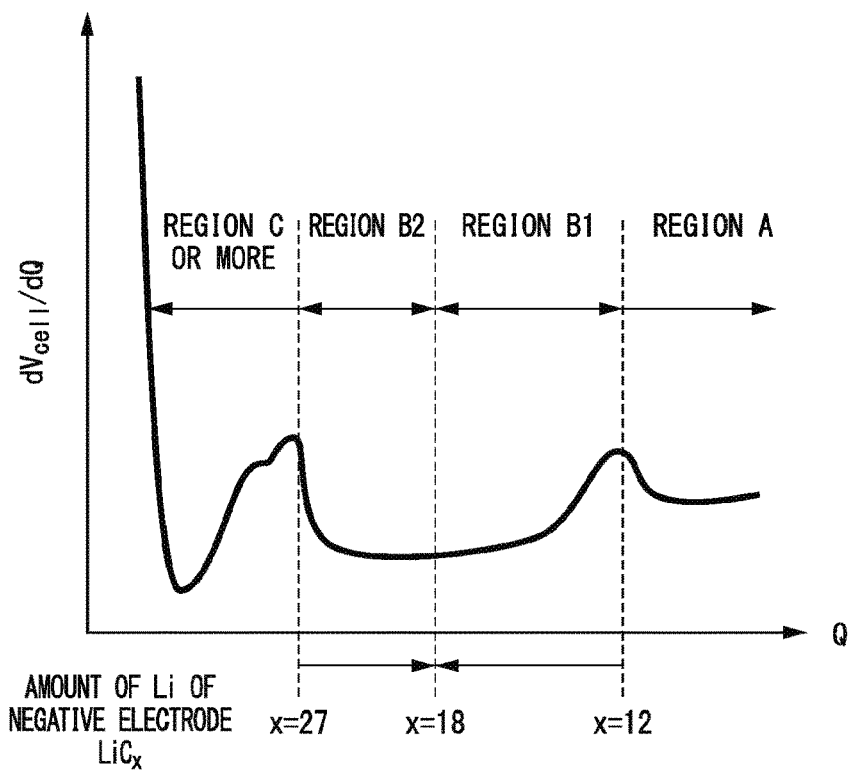
FIG. 8 is an explanatory diagram (part 2) showing switching between regions.

FIG. 8 is an explanatory diagram (part 2) showing switching between regions. Hereinafter, the graph shown in FIG. 8 may be referred to as a "second region determination model". The vertical axis of FIG. 8 represents a differential $dV_{cell}/dQ$ (V/Ah) of a cell voltage and the horizontal axis of FIG. 8 represents a stored power capacity Q.

When the differential $dV_{cell}/dQ$ of the cell voltage related to the capacity Q of the lithium ion battery 40 is plotted with respect to the capacity Q, it is characterized in that a maximum value is present at the region switching point as in FIG. 7. This is because a change in the negative electrode potential is reflected in the cell voltage. Thus, a switching point (a boundary) of the region A and the region B1, a switching point of the region B1 and the region B2, and a switching point of the region B2 and the region C are detected on the basis of the maximum value.

Here, because no peak is detected even when the differential dV/dQ is plotted with respect to the capacity Q as shown in FIGS. 7 and 8, the switching point of the region B1 and the region B2 is obtained from the Li stoichiometry ratio x of Li graphite ($LiC_x$). The switching point of the region A and the region B1 corresponds to x=12, the switching point of the region B1 and the region B2 corresponds to x=18, and the switching point of the region B2 and the region C corresponds to x=27. For example, the switching point of the region B1 and the region B2 is obtained as x=18 on the basis of a capacity difference between the switching point x=12 of the region A and the region B1 and the switching point x=27 of the region B2 and the region C.

[Summary of Region Switching Points]

Figure 9:
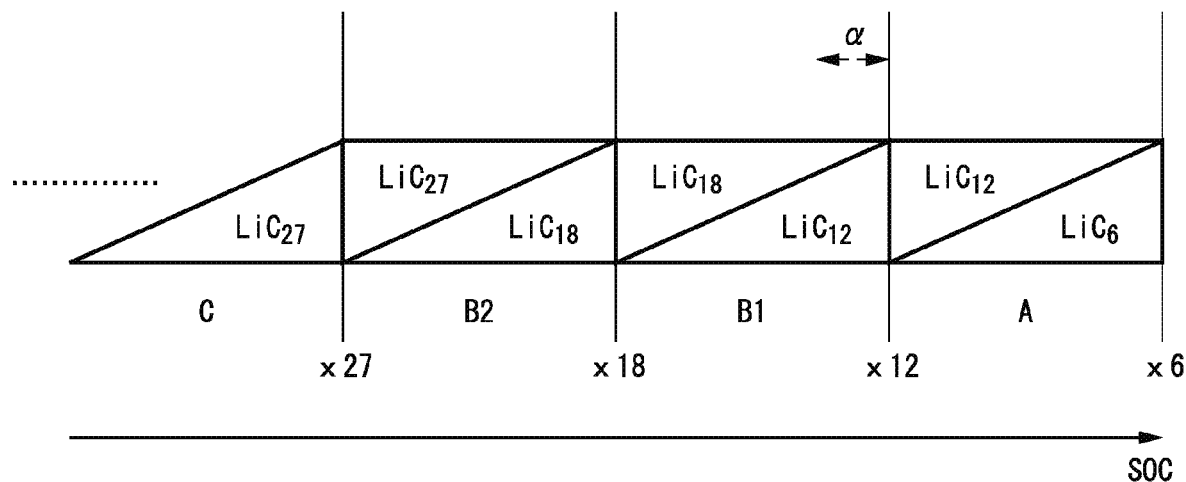
FIG. 9 is a diagram conceptually showing switching points of regions A, B1, and B2.

FIG. 9 is a diagram conceptually showing switching points of the region A, the region B1, and the region B2. "$LiC_{18}$" appears at the switching point x=27 and "$LiC_{18}$" increases and becomes dominant when the switching point is close to x=18. Although "$LiC_{27}$" is dominant at the switching point x=27, "$LiC_{27}$" decreases when the switching point is close to x=18.

The term "dominant" means that a proportion of "$LiC_n$ (n is any natural number)" is higher than a proportion of "$LiC_z$ (z is any natural number different from n)" having another degree of occlusion represented by a stoichiometric ratio or the proportion of "$LiC_n$" is greater than or equal to a threshold value such as in, for example, 30% or more, 50%, or 80% or more when attention is focused on "$LiC_n$" having a degree of occlusion represented by a stoichiometric ratio.

"$LiC_{12}$" appears at the switching point x=18 and "$LiC_{12}$" increases and becomes dominant when the switching point is close to x=12. Although "$LiC_{18}$" is dominant at the switching point x=18, "$LiC_{18}$" decreases when the switching point is close to x=12.

"$LiC_6$" appears at the switching point x=12 and "$LiC_6$" increases and becomes dominant when the switching point is away from x=12. Although "$LiC_{12}$" is dominant at the switching point x=12, "$LiC_{12}$" decreases when the switching point is away from x=12.

A case in which the region B1 has a range of the switching point x=18 to 12 has been described. Alternatively, a range in which "$LiC_{12}$" is dominant may be used or any range in the range of the switching point x=18 to 12 may be used. Any range may be, for example, a range which does not include a prescribed range (for example, α in FIG. 9) from the switching point x=12 in a range in which "$LiC_{12}$" is dominant Thereby, the state of the lithium ion battery 40 can be controlled more reliably in the range where the deterioration rate is low.

[Derivation of Region Switching Point (Part 2)]

Figure 10:
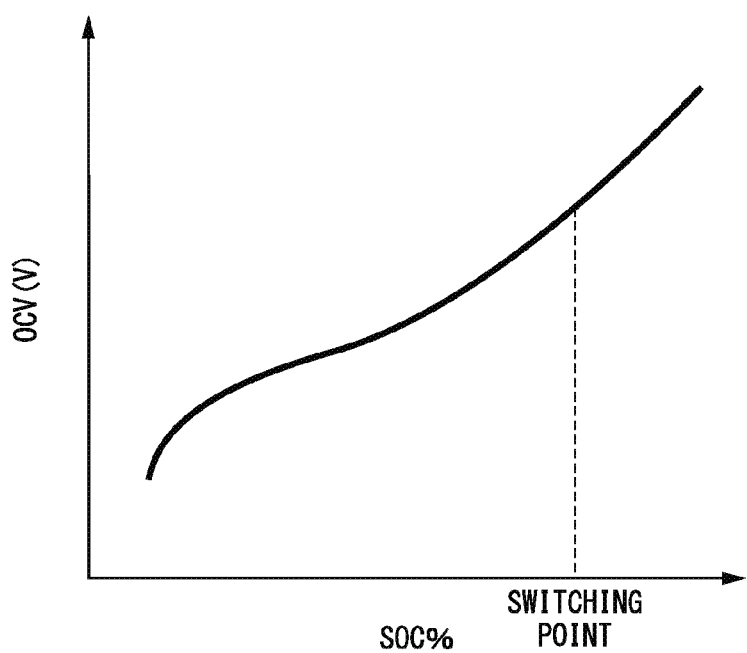
FIG. 10 is an explanatory diagram showing identification of a switching point.

Instead of identifying the switching point as shown in FIGS. 7 and 8 described above, the switching point may be identified on the basis of an OCV and an SOC as shown in FIG. 10. FIG. 10 is an explanatory diagram showing identification of a switching point. Hereinafter, a graph shown in FIG. 10 may be referred to as a "third region determination model". The horizontal axis in FIG. 10 represents an SOC with a full charge capacity which is 100% and the vertical axis represents an OCV (V). In the graph of FIG. 10, the switching point or the region is associated with the SOC. For example, the SOC obtained from the OCV is estimated, and the region is determined on the basis of the estimated SOC.

The OCV and the SOC may be estimated on the basis of a closed circuit voltage (CCV) of the cell. In this case, the control device 100 acquires an internal resistance value R of the lithium ion battery 40 on the basis of a detection value of the sensor and a prescribed estimation technique. Then, the control device 100 estimates the OCV using the internal resistance value R, a current I flowing through an internal resistor, and the CCV by means of Eq. (1). The internal resistance value R including a delay component may be calculated using an n-stage R (RC) equivalent circuit model and the OCV may be calculated.

$$OCV = CCV - IR \qquad (1)$$

[Learning Device]

Figure 13:
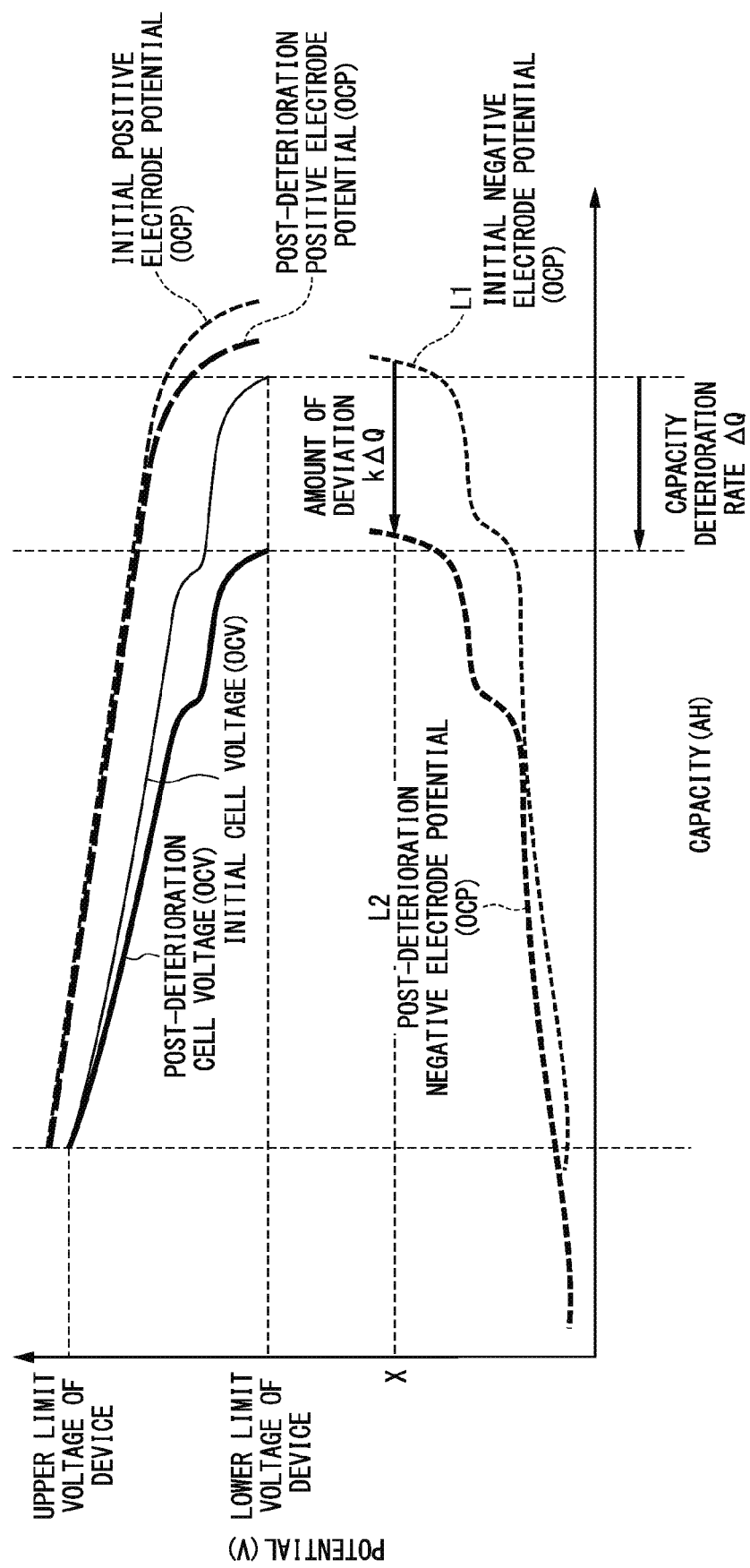
FIG. 13 is a diagram showing an example of relationships between a battery capacity and a potential before and after deterioration.

The learning device 200 generates a region determination model 124 on the basis of a change in a region according to a determination index. The region determination model 124 includes, for example, one or more models among first to third region determination models. The determination index includes one or more indexes for determining the region B1. The determination index is, for example, an index according to the above-described capacity of the lithium ion battery 40 (for example, a capacity (Ah) of FIG. 5 or a capacity (Q) of FIG. 7), the SOC and the OCV (a cell open circuit voltage) as shown in FIG. 10, and a first correlation between the SOC and the OCV of the lithium ion battery 40 or an index according to a second correlation. The index according to the second correlation includes indices of a capacity (Ah) and a voltage such as an OCV (or a potential such as an OCP) as shown in FIG. 5 and FIG. 13 to be described below. The determination index may be dV/dQ or $dV_{cell}/dQ$ of the negative electrode as shown in FIGS. 7 and 8. The learning device 200 is another example of the "generator".

[Process Using Switching Point]

Figure 11:
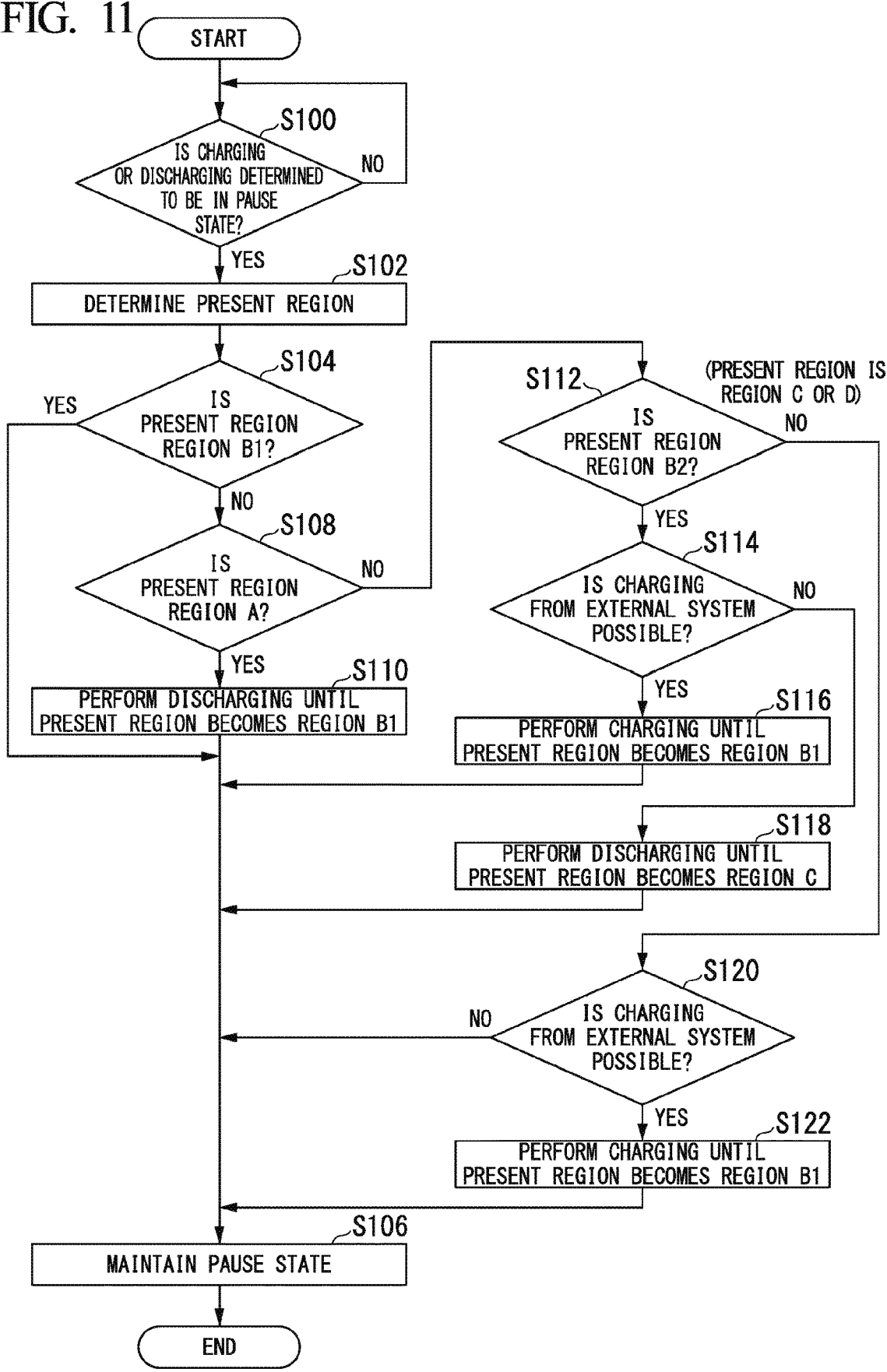
FIG. 11 is a flowchart showing an example of a flow of a process to be executed by a control device.

FIG. 11 is a flowchart showing an example of a flow of a process to be executed by the control device 100. First, the control device 100 determines whether or not charging or discharging is in a pause state (step S100). The control device 100 may determine whether or not a pause instruction for a power-off state or the like of a device to which the lithium ion battery 40 supplies power has been issued.

When the charging or discharging is in the pause state, the control device 100 refers to the region determination model 124 and determines a present region on the basis of a processing result of the information processor 104 (step S102). Next, the control device 100 determines whether or not the region is the region B1 (step S104). When the region is the region B1, the control device 100 maintains the pause state (step S106).

When the region is not the region B1, the control device 100 determines whether or not the region is the region A (step S108). When the region is the region A, the control device 100 controls the charging and discharging controller 94 and causes the lithium ion battery 40 to be discharged until the state of the lithium ion battery 40 is in the region B1 (step S110).

When the region is not the region A, the control device 100 determines whether or not the region is the region B2 (step S112). When the region is the region B2, the control device 100 determines whether or not charging from the external system is possible (step S114). When charging from the external system is possible, the control device 100 controls the charging and discharging controller 94 and causes the lithium ion battery 40 to be charged until the state of the lithium ion battery 40 is in the region B1 (step S116). When charging from the external system is not possible, the control device 100 controls the charging and discharging controller 94 and causes the lithium ion battery 40 to be discharged until the state of the lithium ion battery 40 is in the region C (step S118).

When the region is not the region B2 (when the region is the region C or the region D), the control device 100 determines whether or not charging from the external system is possible (step S120). When charging from the external system is possible, the control device 100 controls the charging and discharging controller 94 and causes the lithium ion battery 40 to be charged until the state of the lithium ion battery 40 is in the region B1 (step S122). Then, the process proceeds to the processing of step S106. That is, when the lithium ion battery is charged by the external system, the control device 100 performs control for stopping charging before an amount of charge exceeds an amount of charge associated with the region B1. When charging from the external system is not possible, the process proceeds to the processing of step S106. Thus, the process of one routine of the present flowchart ends.

Figure 12:
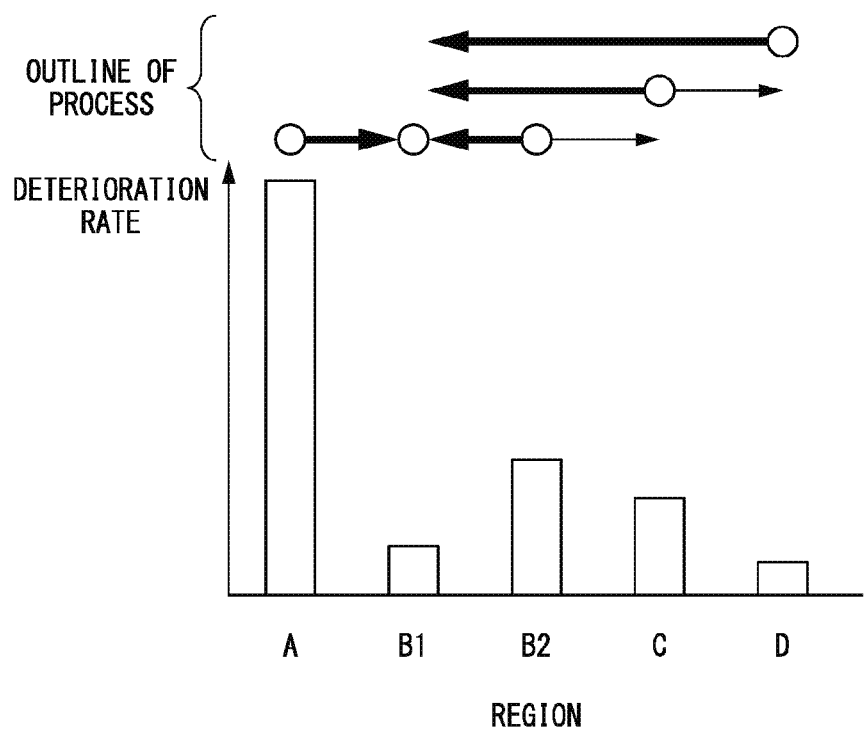
FIG. 12 is a diagram showing a deterioration rate of a region and an outline of a process.

Details of the above-described process can be summarized as shown in FIG. 12. FIG. 12 is a diagram showing a deterioration rate of the region and an outline of the process. For example, in the case of the region A, the region B2, the region C, or the region D, the control device 100 controls charging or discharging of the lithium ion battery 40 so that the region transitions to the region B1 or the region B1 is maintained. This control may be executed when charging or discharging of the lithium ion battery 40 is performed or may be executed when charging or discharging is not performed. When the region is the region B2 and the charging is not possible, the control device 100 may discharge the lithium ion battery 40 for the transition to the region C.

In the case of the region C or the region D, the state of the region C or the region D may be maintained, or the lithium ion battery 40 may be controlled for the transition to the region B1. When there is a region having a degree of deterioration smaller than the present region, charging or discharging may be performed for the transition from the present region to a region having a low deterioration rate. The control may be performed when a prescribed condition related to a future use plan or charging plan of power, the presence/absence of a charging facility on a travel route, or the like is satisfied.

(Control Related to Charging Stop)

When the power storage system 1 has acquired a charging instruction from an external system, the control device 100 may stop charging in a region with a lower deterioration rate. For example, when a lower limit of the target SOC set on the basis of the charging or discharging plan of the power storage system 1 is lower than a level of the SOC reaching the region A, the control device 100 may stop charging within the lower limit of the target SOC or the SOC range of the region B1. For example, when the lower limit of the target SOC set on the basis of the charging or discharging plan of the power storage system 1 is lower than a level of the SOC reaching the region B2, the control device 100 may stop charging within the SOC range of the lower limit of the target SOC or the SOC range of the upper limit of the region C.

For example, when a vehicle equipped with the power storage system 1 is a hybrid vehicle, charging of power generated by regeneration may be minimized or the vehicle may travel by minimizing the use of the motor and actively operating the engine so that the region B1 is maintained or the approach from another region (for example, the region A, the region B2, or the region C) to the region B1 is made.

The control device 100 may acquire the next destination and stop charging on the basis of the SOC necessary for traveling to the acquired destination. For example, when traveling of about several kilometers is scheduled, the control device 100 determines to maintain the region C and the region D in the case of the region C or the control device 100 controls the state of the lithium ion battery by making the transition to the state of region C according to charging from the external system in the case of the region D. Thereby, the vehicle can travel for about several kilometers. When traveling of about several tens of kilometers is scheduled, the control device 100 may control the state of the lithium ion battery 40 so that the region transitions to the region B1 instead of the region D.

Furthermore, when there is an instruction for stopping charging in a range of the region C if it is possible to manually operate the end of charging, the control device 100 may extend charging for minimizing deterioration until the region B1 is reached when the user's permission has been obtained or cause a display of the vehicle to display details for recommending an extension of charging.

(Control During Device Operation)

When a device receiving power supplied from the lithium ion battery 40 is operating (when the lithium ion battery 40 is supplying power), the control device 100 minimizes deterioration by performing load control for prioritizing movement from a region having a high deterioration rate to a region having a lower deterioration rate. That is, when the region is determined to be different from the region B1 in an operation state in which the lithium ion battery 40 is supplying power, the control device 100 performs control for causing the lithium ion battery 40 to be charged with power or causing power of the lithium ion battery 40 to be discharged actively so that the degree of occlusion is close to a degree of occlusion associated with the region B1 or the degree of occlusion is close to a degree of occlusion associated with a region having a lower deterioration rate than a different region as compared with when the region is determined to be the region B1. The different region is a region which is determined to be different from the region B1.

For example, when it is determined that the state is a state of the region A, the control device 100 sets necessary minimum charging and prioritizes discharging for the transition to the region B1. When it is determined that the state is a state of the region B1, the control device 100 limits charging and discharging so that the state is not in the region A or the region B2. When it is determined that the state is a state of the region B2, the control device 100 prioritizes charging in the case of the SOC close to the region B1 and prioritizes discharging in the case of the SOC close to the region C. When it is determined that the state is a state of the region C or the region D, the control device 100 limits a charging current so that the state is not in the region B2. The control may be performed in an allowed range for an operation condition of a specific device for controlling charging or discharging of the lithium ion battery 40, a required load, or the like.

As described above, the control device 100 can further minimize the deterioration of the lithium ion battery 40 by controlling the lithium ion battery 40 so that a region having a low deterioration rate is maintained in the state of the negative electrode.

[Correction]

As described below, when the region is determined, correction may be performed in consideration of a degree of deterioration of the lithium ion battery 40.

The control device 100 estimates a region in a present integrated capacity (or an OCV and an SOC) on the basis of a relationship between a capacity (or an OCV and an SOC) and a region acquired in advance. When the lithium ion battery 40 deteriorates, a relationship between an OCV, a negative electrode OCP, a capacity, and a region changes as shown in FIG. 13. Thus, it is necessary to make a correction according to the deterioration of the lithium ion battery 40.

FIG. 13 is a diagram showing an example of relationships between a battery capacity and a potential before and after deterioration. The vertical axis in FIG. 13 represents a potential (V) and the horizontal axis in FIG. 13 represents a discharge capacity (Ah). For example, at a prescribed potential X in a curve L1 indicating an initial negative electrode potential (OCP) before deterioration and a curve L2 indicating the negative electrode potential (OCP) after deterioration, a capacity in the curve L2 tends to be less than a capacity in the curve L1. An extent of the difference in the capacity is referred to as "an amount of deviation k$\Delta$Q" to be described below.

For example, the learning device 200 acquires a relationship of an amount of deviation of a region related to a capacity deterioration rate $\Delta$Q and a capacity or an SOC in advance and calculates a correction coefficient k of a region corresponding to the capacity deterioration rate $\Delta$Q on the basis of the acquired relationship. The capacity deterioration rate $\Delta$Q is a difference between an initial value and a value after the deterioration in a capacity at which the cell voltage reaches the lower limit voltage. The correction coefficient k is a coefficient generated on the basis of a difference between a change in the positive electrode potential (or the cell voltage) before deterioration and a change in the positive electrode potential (or the cell voltage) after deterioration. That is, the correction coefficient k is a coefficient set in accordance with a degree to which the change in the positive electrode potential after deterioration is reduced so that the change in the positive electrode potential after deterioration is similar to the change in the positive electrode potential before deterioration as shown in FIG. 13. Then, correction information which is information of the correction coefficient k is stored in the storage 120 of the control device 100.

For example, the control device 100 can obtain a region switching point by means of Eq. (2). Qca denotes a capacity of the region switching point after deterioration and Qcb denotes a capacity of the region switching point before deterioration.

$$Qca = Qcb + k\Delta Q \qquad (2)$$

The correction coefficient k may be adjusted appropriately. For example, the correction coefficient k may be adjusted according to operation conditions of a specific device or the like such as a temperature of the lithium ion battery 40, an SOC range, and a current value. For example, the correction coefficient k is a coefficient associated with each temperature. For example, the correction coefficient k tends to be larger when the temperature is higher. The control device 100 can estimate a region after deterioration more accurately using the correction coefficient k according to the operation conditions and the operation history.

Figure 14:
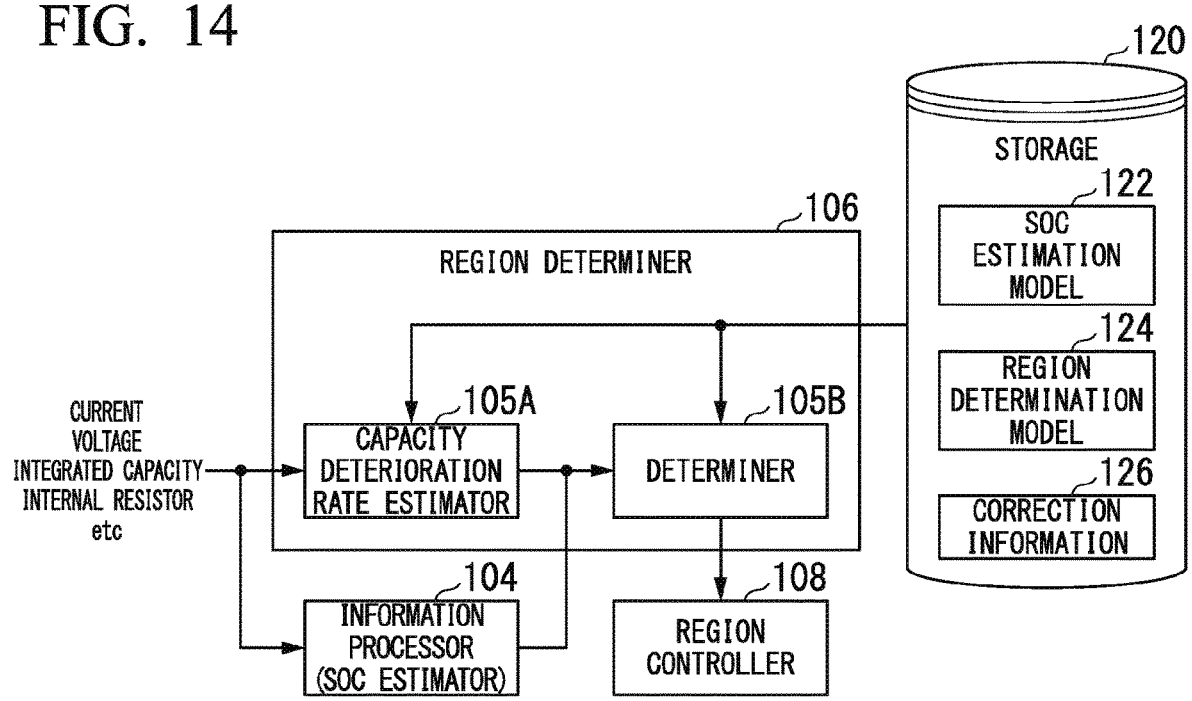
FIG. 14 is an explanatory diagram showing a correction process.

FIG. 14 is an explanatory diagram showing a correction process. The region determiner 106 includes, for example, a capacity deterioration rate estimator 105A and a determiner 105B. The storage 120 stores correction information 126 which is information of the correction coefficient k.

The capacity deterioration rate estimator 105A derives the correction coefficient k to be currently used, for example, with reference to the operation history from the start time of use of the lithium ion battery 40 to the present time and the correction information 126. For example, the determiner 105B corrects a capacity (or an SOC) estimated by the information processor 104 using the correction coefficient k, applies the corrected capacity to the region determination model 124, and determines a region.

Figure 15:
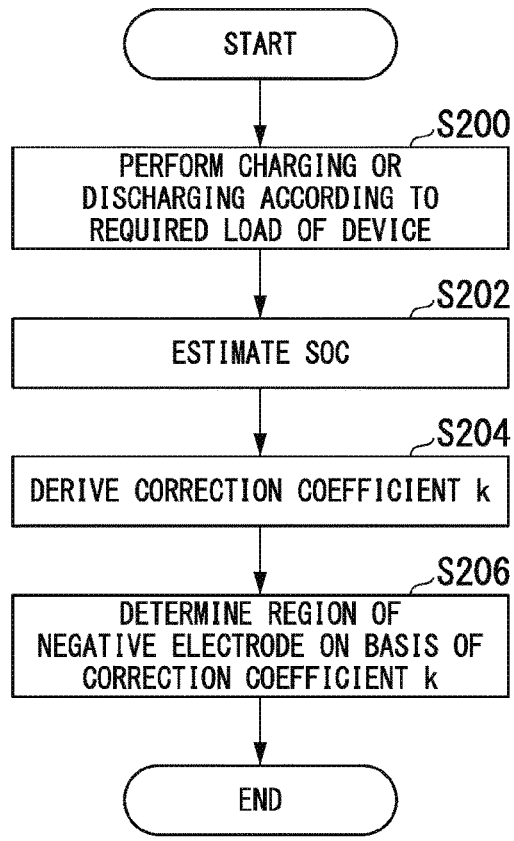
FIG. 15 is a flowchart showing an example of a flow of a process to be executed by a region determiner.

FIG. 15 is a flowchart showing an example of a flow of a process to be executed by the region determiner 106. In the present process, the correction is assumed to be performed on the SOC instead of the capacity Q.

First, the power storage system 1 causes the lithium ion battery 40 to be charged and discharged according to a required load of a specific device (step S200). Next, the information processor 104 estimates an SOC (step S202). Next, the capacity deterioration rate estimator 105A derives a correction coefficient k to be currently used with reference to an operation history of the lithium ion battery 40 and correction information 126 (step S204). Next, the determiner 105B determines a region of the negative electrode on the basis of the SOC estimated by the information processor 104 and the correction coefficient k (step S206). Thereby, the process of one routine of the present flowchart ends.

As described above, the control device 100 can determine the region of the negative electrode more accurately in consideration of the deterioration of the lithium ion battery 40.

[Updating of Region Determination Model (Part 1)]

The control device 100 may update a region determination model 124 at any timing instead of (or in addition to) using the correction coefficient k. For example, the updater 110 performs constant-current charging and constant-current discharging for dV/dQ analysis in the power storage system 1 and updates the region determination model 124 generated on the basis of a correlation between the present region and a capacity (or an OCV or an SOC). Thereby, the control device 100 can acquire the region determination model 124 according to a degree of deterioration.

It is desirable to make a value of a constant current used in the above update as small as possible in order to improve the estimation accuracy of the region. For example, although the value of the constant current depends on the design of the battery, a C rate is preferably 1 C or less, more preferably 0.1 C or less.

Although the control device 100 may use a CCV as it is in the dV/dQ analysis, the OCV may be estimated by applying an internal resistance value R and the CCV to the above-described Eq. (1). Then, the control device 100 may generate data of the OCV for the capacity using the estimated OCV and perform the dV/dQ analysis using the data of the OCV.

It is preferable to make a level of the SOC at the start of constant-current charging in the dV/dQ analysis as low as possible. For example, it is more preferable that the SOC be a set lower limit SOC. It is preferable to make a level of the SOC at the start of constant-current discharging for the dV/dQ analysis as high as possible and it is more preferable that the SOC be a set upper limit SOC.

The control device 100 can perform the constant-current discharging and the constant-current charging, for example, when an instruction for pausing the specific device has been output or when the charging or discharging of the lithium ion battery 40 has been in the pause state.

Although the control device 100 can also perform the constant-current discharging and the constant-current charging at each pause time of the specific device, a capacity deterioration amount may be estimated on the basis of an operation situation of the specific device or a future operation plane of the specific device and a previously measured amount of used power and the constant-current discharging and the constant-current charging may be performed periodically at a timing derived on the basis of an estimation result.

An external diagnostic device for analyzing dV/dQ may perform the constant-current discharging and the constant-current charging and may update the region determination model 124 generated on the basis of a correlation between the region and the capacity. The external diagnostic device is connected to the power storage system 1 to perform the control for the updating. This method is assumed to be carried out at the time of periodic inspection and maintenance of the power storage system 1.

(Flowchart)

Figure 16:
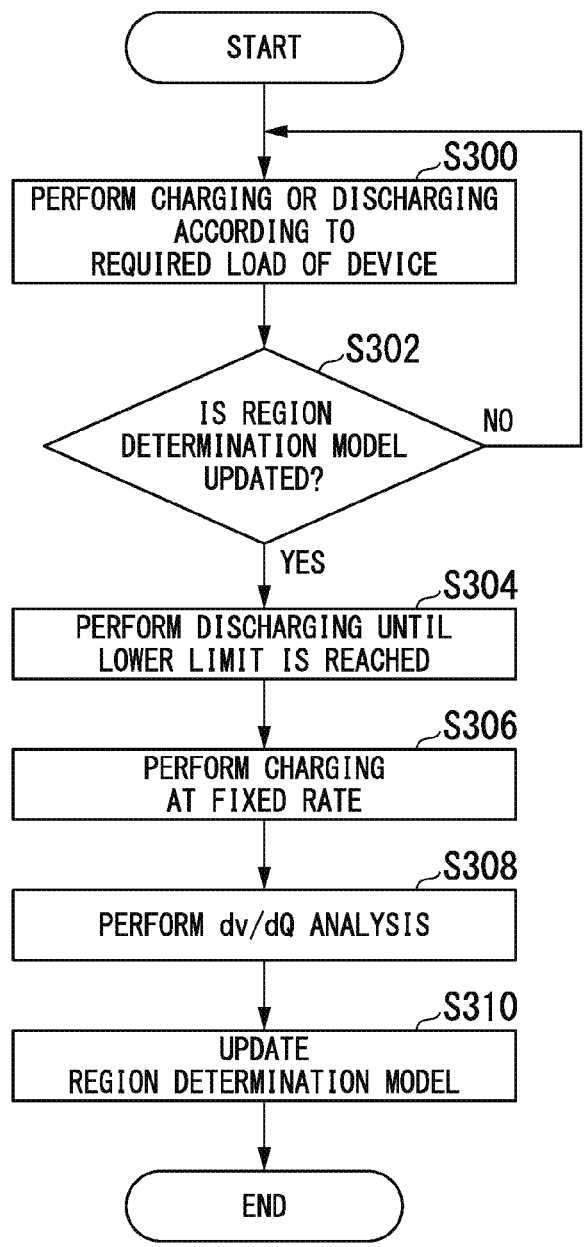
FIG. 16 is a flowchart showing an example of a flow of a process to be executed by an updater.

FIG. 16 is a flowchart showing an example of a flow of a process to be executed by the updater 110. First, the control device 100 controls charging or discharging according to a required load of a specific device (step S300). Next, the updater 110 of the control device 100 determines whether or not a timing for updating the region determination model 124 has been reached (step S302). When the timing for updating the region determination model 124 has been reached, the updater 110 controls the lithium ion battery 40 so that the lithium ion battery 40 is discharged to a preset lower limit (step S304). Next, the updater 110 controls the lithium ion battery 40 so that the lithium ion battery 40 is charged at a fixed rate (step S306).

Next, the updater 110 performs dV/dQ analysis (step S308) and updates the region determination model 124 (step S310). Thereby, the process of one routine of this flowchart ends.

Figure 17:
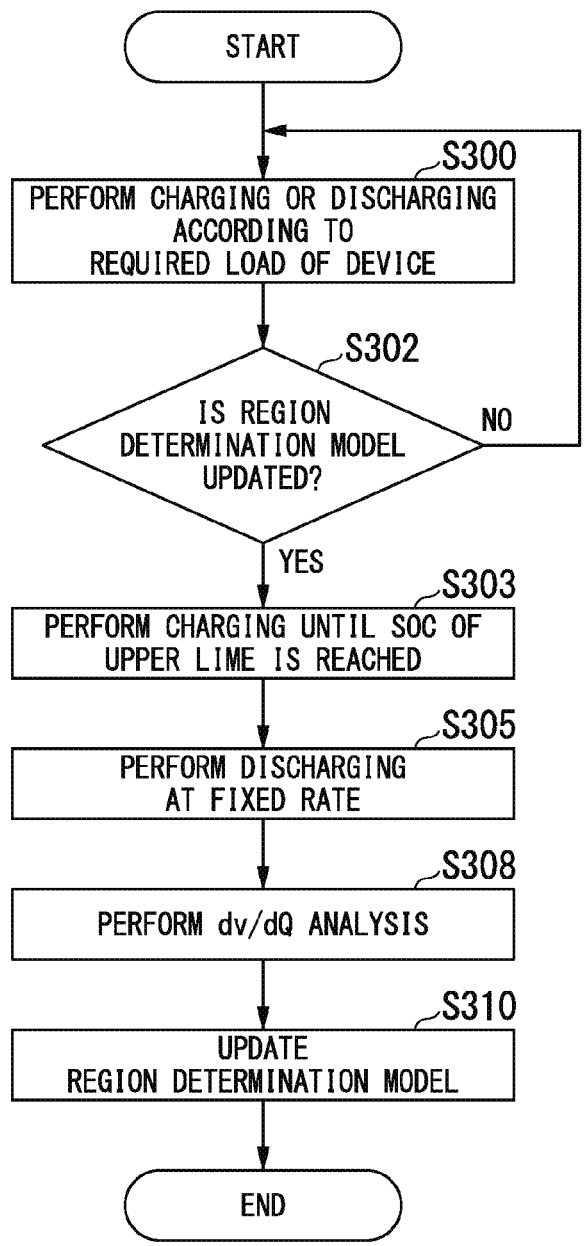
FIG. 17 is a flowchart showing another example of a flow of a process to be executed by the updater.

FIG. 17 is a flowchart showing another example of a flow of a process to be executed by the updater 110. A process (steps S303 and S305) different from the process of FIG. 16 will be described. When a timing for updating the region determination model 124 has been reached, the updater 110 controls the lithium ion battery 40 so that the lithium ion battery 40 is charged until the SOC of the preset upper limit is reached (step S303). Next, the updater 110 controls the lithium ion battery 40 so that the lithium ion battery 40 is discharged at a fixed rate (step S305). Then, after the processing of steps S308 and S310, the process of one routine of the present flowchart ends.

When the correlation is updated by the external diagnostic device, the external diagnostic device is connected to the control device 100 in the processing of steps S300 and S302 in FIG. 15 or 16. When a timing for updating the region determination model 124 has been reached, the processing of steps S304 to S310 of FIG. 16 or the processing of steps S303 to S310 of FIG. 17 is performed according to the control of the external diagnostic device.

As described above, the updater 110 can determine the region of the negative electrode more accurately in consideration of the deterioration of the lithium ion battery 40 by updating the region determination model 124.

[Updating of Region Determination Model (Part 2)]

When the lithium ion battery 40 is charged from the external system, the updater 110 of the control device 100 may perform dV/dQ analysis from measured values of a current, a voltage, and a capacity thereof. When charging is performed with a constant current, the updater 110 may perform dV/dQ analysis using the measured values of the voltage and the capacity at that time as they are.

At this time, there may be a case in which a level of a charging start SOC is high and a peak associated with switching between regions cannot be observed. There may also be a case in which a level of a charging end SOC is low and a peak associated with switching between regions cannot be observed.

In this case, the updater 110 may use a previous measurement result related to charging in a sufficient SOC range in which the peak can be detected as it is without performing the dV/dQ analysis and may save measurement values of a plurality of previous charging processes, create voltage data of a sufficient SOC range by combining data of the measurement values, and perform the dV/dQ analysis using the voltage data. For data combination, for example, when the measured SOC ranges overlap, an average value or a most frequent value of stored measurement values may be adopted.

As described above, the updater 110 can update the region determination model 124 while minimizing ineffective charging or discharging by updating the region determination model 124 when charging from the external system is performed. The updater 110 updates the region determination model 124 so that the region can be determined more accurately even if the information is insufficient by updating the region determination model 124 using the previous measurement results.

[Updating of Region Determination Model (Part 3)]

Figure 18:
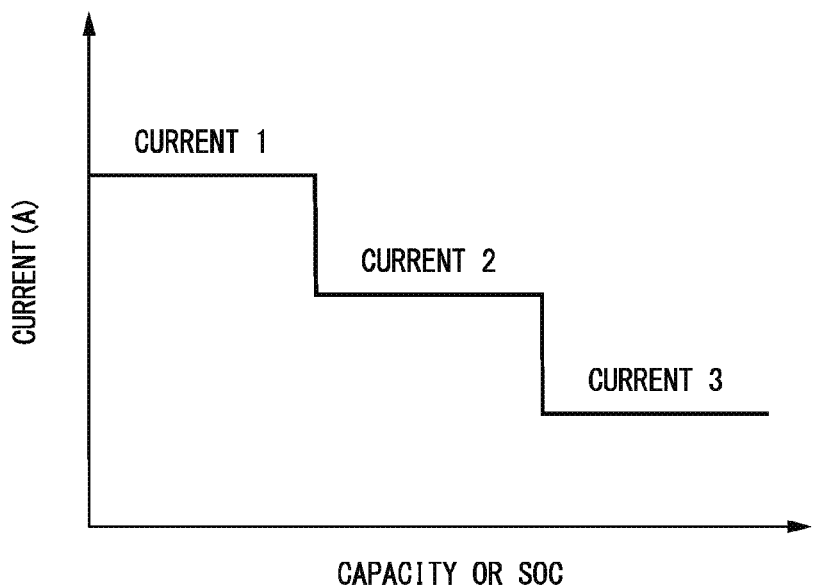
FIG. 18 is a diagram showing an example of a charging current which changes in a stepwise manner.

When the charging current changes in a stepwise manner as shown in FIG. 18, the updater 110 may perform dV/dQ analysis for each stepwise current value or may create data of an OCV related to a capacity by estimating an OCV from a CCV using the internal resistance value R and perform dV/dQ analysis using the data of the OCV. FIG. 18 is a diagram showing an example of a stepwise changing current. The vertical axis in FIG. 18 represents a current, and the horizontal axis in FIG. 18 represents a capacity or an SOC.

Figure 19:
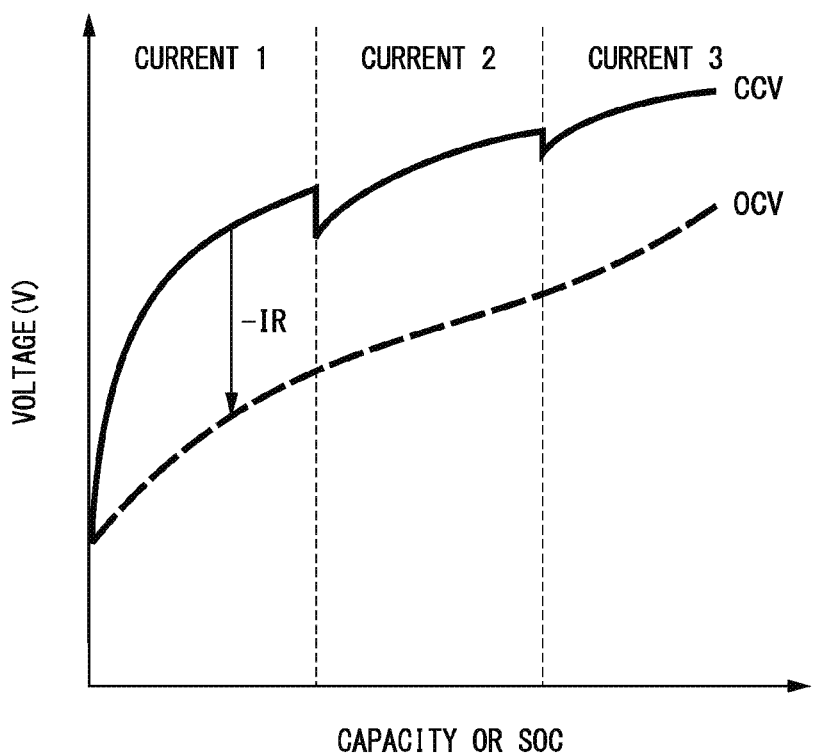
FIG. 19 is a diagram showing an example of an OCV estimated on the basis of an internal resistance value R and a CCV.

FIG. 19 is a diagram showing an example of an OCV estimated on the basis of the internal resistance value R and the CCV. The vertical axis in FIG. 19 represents a voltage (V), and the horizontal axis in FIG. 19 represents a capacity or an SOC. The updater 110 estimates a voltage obtained by subtracting IR from the voltage (V) of the CCV as an OCV. Then, the updater 110 performs dV/dQ analysis using the estimated OCV.

As described above, the updater 110 can update the region determination model 124 so that the region can be determined more accurately even if the current changes in a stepwise manner.

[Updating of Region Determination Model (Part 4)]

Figure 20:
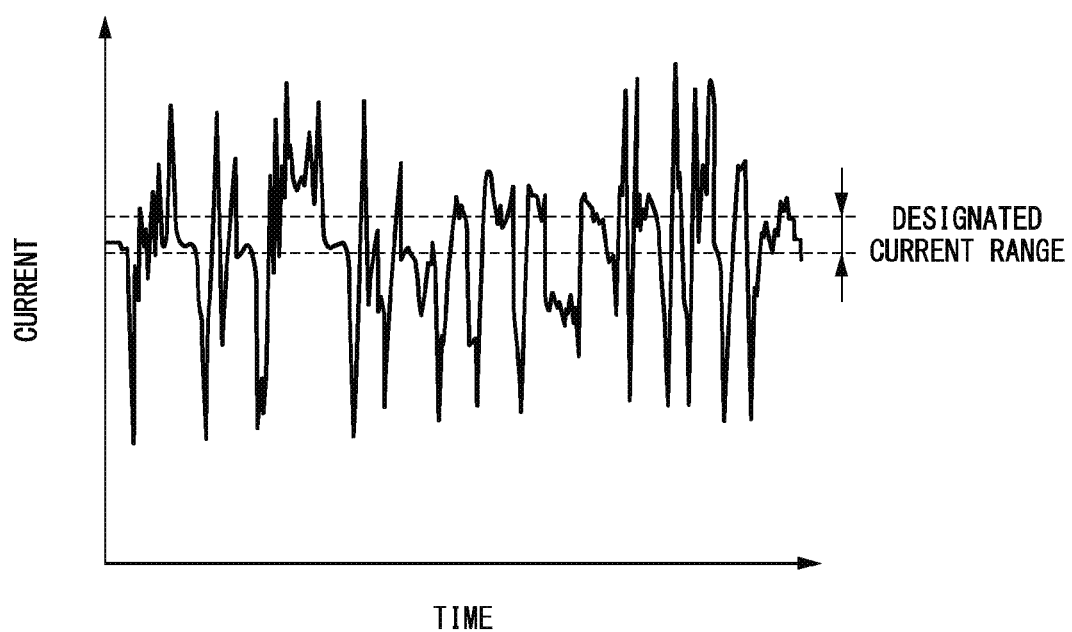
FIG. 20 is a diagram showing an example of a specified current range.

The updater 110 may calculate dV/dQ when pseudo constant-current discharging or charging has been performed by extracting only a relationship between a current (a designated current range) and a voltage in a range of a certain fixed charging or discharging rate from a charging or discharging history when the specific device operates as shown in FIG. 20 and combining the extracted relationship.

The updater 110 can more accurately determine the region on the basis of dV/dQ using the OCV estimated using the internal resistance value R in the method described in the above-described (part 2) in the combining of the voltage data. The updater 110 may use the latest value, the average value, the most frequent value, or the like when data exists in the same SOC range. In this method, there is a possibility that discontinuous points of data will be present and noise of the voltage value may increase as compared with the above-described method (part 1). In such a case, the updater 110 may perform smoothing using a moving average or a spline curve.

Charging and discharging rate ranges are set on the basis of a frequency of the required load of the specific device and an amount of data of the charging and discharging history capable of being stored. For example, the charging and discharging rate ranges are set on the basis of the amount of data required to calculate dV/dQ. At this time, it is desirable that a width and value of the rate be as small as possible.

(Flowchart)

Figure 21:
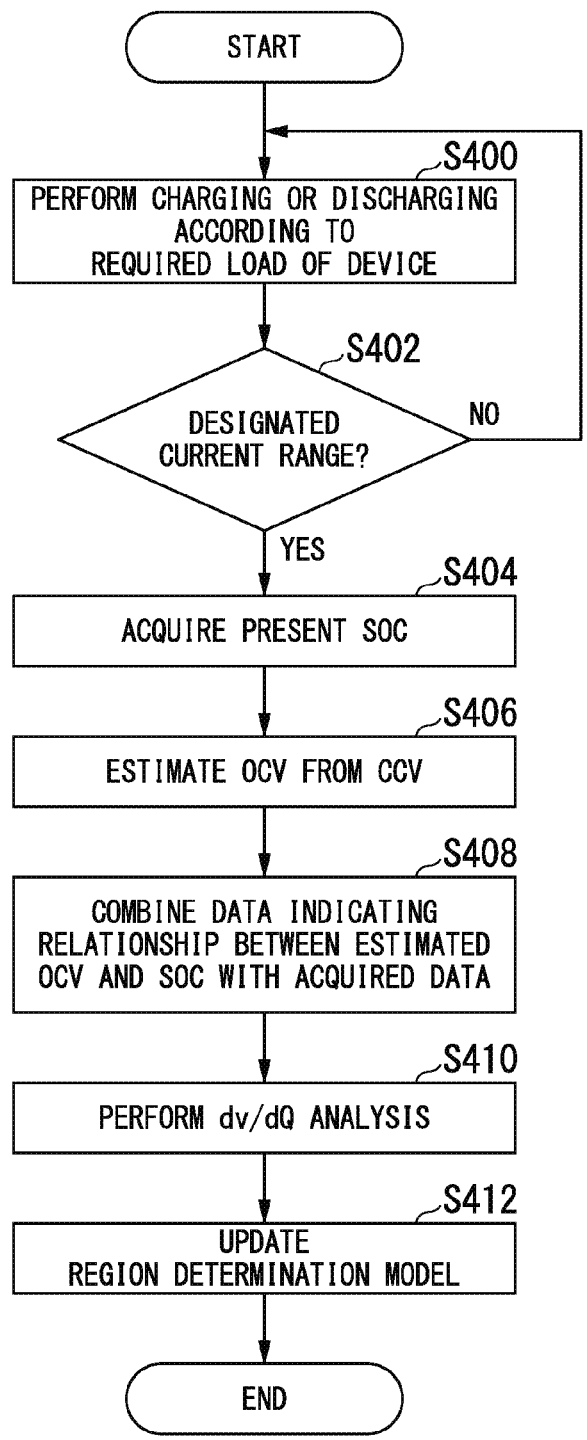
FIG. 21 is a flowchart showing another example of a flow of a process to be executed by the updater.

FIG. 21 is a flowchart showing another example of a flow of a process to be executed by the updater 110. First, the control device 100 controls charging or discharging according to a required load of a specific device (step S400). Next, the updater 110 of the control device 100 determines whether or not charging or discharging has been performed in a designated current range (step S402). When charging or discharging has been performed in the designated current range, the updater 110 acquires a present SOC when charging or discharging has been performed in the designated current range (step S404). This SOC is an SOC estimated by the information processor 104.

Next, the updater 110 estimates an OCV on the basis of a CCV (voltage data) when charging or discharging is performed in the designated current range (step S406). Next, the updater 110 complements data which is insufficient by combining the data indicating the estimated relationship between the SOC and the CCV with the acquired data (step S408).

Next, the updater 110 performs dV/dQ analysis (step S410) and updates the region determination model 124 (step S412). Thereby, the process of one routine of the present flowchart ends. By performing the above-described process, the updater 110 can efficiently update the region determination model 124.

The methods provided as exemplary examples in [Correction] and [Updating of region determination model (part 1) to (part 4)] described above may be used independently may be arbitrarily performed in combination. In this manner, the regions can be determined more accurately by arbitrarily combining the methods. Each of the above-described techniques may be applied to the SOC estimation model 122 that estimates the SOC.

According to the embodiment described above, the control device 100 for controlling charging or discharging of the lithium ion battery 40 in which a degree of occlusion of lithium ions occluded in graphite of a negative electrode changes in accordance with an amount of stored power acquires a determination index related to the degree of occlusion and performs control for causing the lithium ion battery 40 to be charged with power or causing power of the lithium ion battery 40 to be discharged so that the degree of occlusion is close to the degree of occlusion associated with a region B1 when a region associated with the degree of occlusion is determined not to be the region B1 associated with the degree of occlusion which includes $LiC_{12}$ having a degree of occlusion represented by a stoichiometric ratio and does not include $LiC_6$ having a degree of occlusion represented by a stoichiometric ratio on the basis of the acquired determination index, thereby further minimizing deterioration of the lithium ion battery 40.

[Hardware Configuration]

Figure 22:
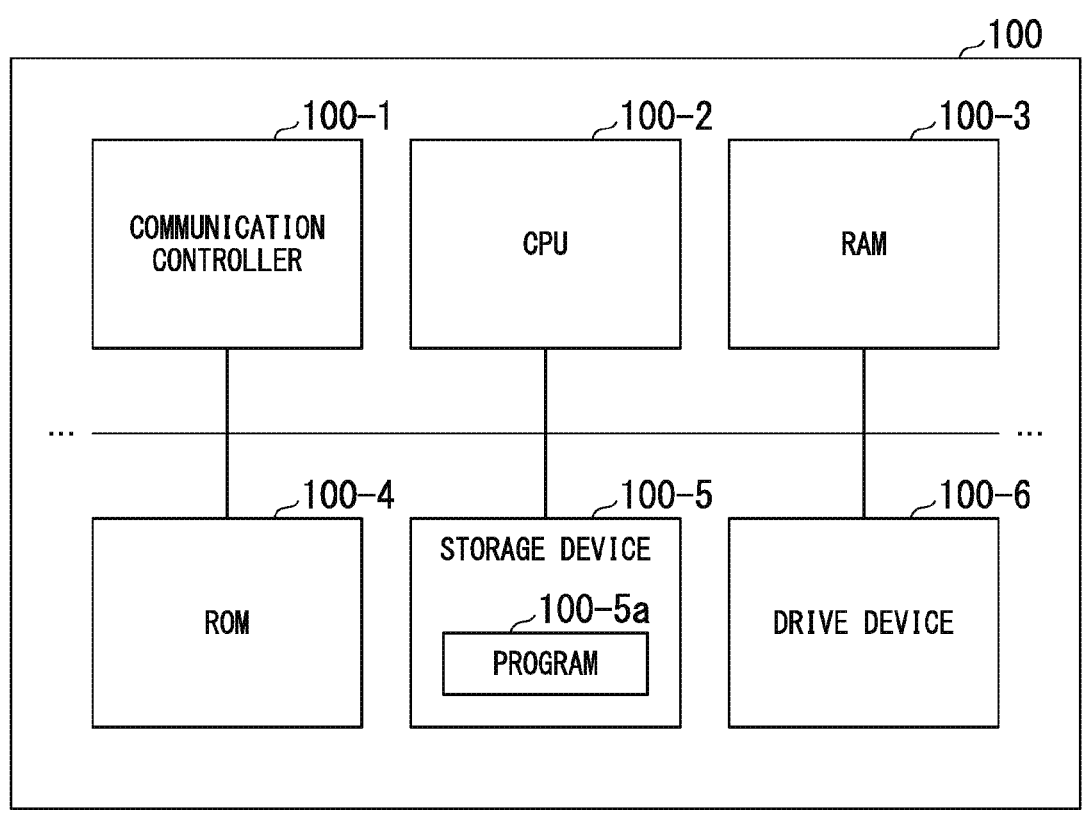
FIG. 22 is a diagram showing an example of a hardware configuration of a control device of an embodiment.

FIG. 22 is a diagram showing an example of a hardware configuration of the control device 100 of the embodiment. As shown, the control device 100 has a configuration in which a communication controller 100-1, a CPU 100-2, a random access memory (RAM) 100-3 used as a working memory, a read only memory (ROM) 100-4 storing a boot program and the like, a storage device 100-5 such as a flash memory or a hard disk drive (HDD), a drive device 100-6, and the like are mutually connected by an internal bus or a dedicated communication line. The communication controller 100-1 communicates with components other than the control device 100. A program 100-5a executed by the CPU 100-2 is stored in the storage device 100-5. This program is loaded to the RAM 100-3 by a direct memory access (DMA) controller (not shown) or the like and executed by the CPU 100-2. Thereby, some or all of the information manager 102, the information processor 104, the region determiner 106, the region controller 108, and the updater 110 are implemented.

The embodiment described above can be implemented as follows.

A control device including:
  a storage device configured to store a program; and
  a hardware processor,
  wherein the hardware processor executes the program stored in the storage device to:
  acquire a determination index related to a degree of occlusion of a lithium ion battery in which the degree of occlusion of lithium ions occluded in graphite of a negative electrode changes in accordance with an amount of stored power; and
  perform control for causing the lithium ion battery to be charged with power or causing power of the lithium ion battery to be discharged so that the degree of occlusion is close to a degree of occlusion associated with a specific region when a region associated with the degree of occlusion is determined not to be the specific region associated with the degree of occlusion which includes $LiC_{12}$ having a degree of occlusion represented by a stoichiometric ratio and does not include LiC$_6$ having a degree of occlusion represented by a stoichiometric ratio on the basis of the acquired determination index.

While modes for carrying out the present invention have been described using embodiments, the present invention is not limited to these embodiments and various modifications and substitutions can be added without departing from the scope of the present invention.

What is claimed is:

1. A lithium ion battery control device for controlling charging or discharging of a lithium ion battery in which a degree of occlusion of lithium ions occluded in graphite of a negative electrode changes in accordance with an amount of stored power, the lithium ion battery control device comprising:
   an acquirer configured to acquire a determination index related to the degree of occlusion; and
   a controller configured to control charging the lithium ion battery with power or control discharging power from the lithium ion battery, so that the degree of occlusion is close to a degree of occlusion associated with a specific region when a region associated with the degree of occlusion is determined not to be the specific region, which includes LiC$_{12}$ having a degree of occlusion represented by a first stoichiometric ratio value and does not include LiC$_6$ having a degree of occlusion represented by a second stoichiometric ratio value on the basis of the determination index acquired by the acquirer,
   wherein the controller is configured to control the charging or the discharging, so that the degree of occlusion is close to the degree of occlusion associated with the specific region when the region associated with the degree of occlusion is determined to be: a first specific region including LiC$_6$ having a degree of occlusion represented by the second stoichiometric ratio value, a second specific region including LiC$_{18}$ having a degree of occlusion represented by a third stoichiometric ratio value, or a third specific region including a structure of a degree of occlusion greater than or equal to that of LiC$_{27}$ having a degree of occlusion represented by a fourth stoichiometric ratio value,
   wherein a deterioration rate of the lithium ion battery decreases in an order of the first specific region, the second specific region, and the third specific region, and the specific region, and
   wherein the controller is configured to control the charging or the discharging, so that the degree of occlusion is close to the degree of occlusion associated with a region having a lower deterioration rate than the region associated with the degree of occlusion.

2. The lithium ion battery control device according to claim 1, wherein the specific region is a region where LiC$_{12}$ is dominant.

3. The lithium ion battery control device according to claim 2, wherein the the second specific region does not include LiC$_{27}$ having a degree of occlusion represented by the fourth stoichiometric ratio value.

4. The lithium ion battery control device according to claim 1, wherein the controller is configured to control the discharging so that the degree of occlusion is close to the degree of occlusion associated with the third specific region, and wherein the charging or the discharging so that the degree of occlusion is close to the degree of occlusion associated with the specific region is determined not to be performed if the region associated with the degree of occlusion is determined to be the second specific region.

5. The lithium ion battery control device according to claim 1, wherein the controller is configured to control the charging so that the degree of occlusion is close to the degree of occlusion associated with the specific region when the lithium ion battery is charged by an external system.

6. The lithium ion battery control device according to claim 1, wherein the controller is configured to stop the charging before an amount of charge exceeds an amount of charge associated with the specific region when the lithium ion battery is charged by an external system.

7. The lithium ion battery control device according to claim 1, wherein the controller is configured to control the charging or the discharging, so that the degree of occlusion is close to the degree of occlusion associated with the specific region or the degree of occlusion is close to a degree of occlusion associated with the region having the lower deterioration rate than the region associated with the degree of occlusion when the region associated with the degree of occlusion is determined to be different from the specific region if supply of power from the lithium ion battery is in a pause state.

8. The lithium ion battery control device according to claim 1, wherein the controller is configured to control the charging or the discharging, so that the degree of occlusion is close to the degree of occlusion associated with the specific region or the degree of occlusion is close to a degree of occlusion associated with the region having the lower deterioration rate than the region associated with the degree of occlusion when the region associated with the degree of occlusion is determined to be different from the specific region in an operation state in which the lithium ion battery is supplying power as compared with when the region associated with the degree of occlusion is determined to be the specific region.

9. The lithium ion battery control device according to claim 1, further comprising a generator configured to generate a model for determining the region associated with the degree of occlusion on the basis of information acquired through the charging or discharging, wherein the charging is a constant-current charging at less than or equal to a prescribed charging rate, and wherein the discharging is a constant-current discharging at less than or equal to a prescribed discharging rate.

10. The lithium ion battery control device according to claim 1, further comprising a generator configured to estimate a relationship between a capacity and a voltage using voltage data in a prescribed current range in the lithium ion battery and generate a model for determining the region associated with the degree of occlusion using an estimation result.

11. A lithium ion battery control device for controlling charging or discharging of a lithium ion battery in which a degree of occlusion of lithium ions occluded in graphite of a negative electrode changes in accordance with an amount of stored power, the lithium ion battery control device comprising:
   an acquirer configured to acquire a determination index related to the degree of occlusion; and
   a controller configured to control charging the lithium ion battery with power or control discharging power from the lithium ion battery, so that the degree of occlusion is close to a degree of occlusion associated with a specific region when a region associated with the degree of occlusion is determined not to be the specific region, which includes LiC$_{12}$ having a degree of occlusion represented by a first stoichiometric ratio value and does not include LiC$_6$ having a degree of occlusion represented by a second stoichiometric ratio value on the basis of the determination index acquired by the acquirer, wherein the determination index is an index according to a capacity of the lithium ion battery, an SOC, a cell open circuit voltage of the lithium ion battery, an index according to a first correlation between the SOC and the cell open circuit voltage, or an index according to a second correlation between a capacity and a voltage, and wherein the controller is configured to further identify a region associated with the degree of occlusion of the lithium ion battery using a degree of deterioration of the lithium ion battery.

12. The lithium ion battery control device according to claim 11, wherein the controller is configured to correct the determination index using a preset correction coefficient according to the degree of deterioration of the lithium ion battery and identify the region associated with the degree of occlusion on the basis of a determination index after the correction.

13. A lithium ion battery control method comprising:

acquiring, by a computer, a determination index related to a degree of occlusion of a lithium ion battery in which the degree of occlusion of lithium ions occluded in graphite of a negative electrode changes in accordance with an amount of stored power; and controlling, by the computer, charging the lithium ion battery with power or discharging power from the lithium ion battery, so that the degree of occlusion is close to a degree of occlusion associated with a specific region when a region associated with the degree of occlusion is determined not to be the specific region, which includes $LiC_{12}$ having a degree of occlusion represented by a first stoichiometric ratio value and does not include $LiC_6$ having a degree of occlusion represented by a second stoichiometric ratio value on the basis of the acquired determination index, controlling, by the computer, the charging or the discharging, so that the degree of occlusion is close to the degree of occlusion associated with the specific region when the region associated with the degree of occlusion is determined to be: a first specific region including $LiC_6$ having a degree of occlusion represented by a stoichiometric ratio, a second specific region including $LiC_{18}$ having a degree of occlusion represented by a stoichiometric ratio, or a third specific region including a structure of a degree of occlusion greater than or equal to that of $LiC_{27}$ having a degree of occlusion represented by a stoichiometric ratio, wherein a deterioration rate of the lithium ion battery decreases in an order of the first specific region, the second specific region, and the third specific region, and the specific region, and controlling, by the computer, the charging or the discharging, so that the degree of occlusion is close to the degree of occlusion associated with a region having a lower deterioration rate than the region associated with the degree of occlusion.

* * * * *